(12) United States Patent
Kaake

(10) Patent No.: US 11,276,822 B2
(45) Date of Patent: Mar. 15, 2022

(54) METHOD OF PATTERNED DEPOSITION EMPLOYING PRESSURIZED FLUIDS AND THERMAL GRADIENTS

(71) Applicant: Simon Fraser University, Burnaby (CA)

(72) Inventor: Loren Gregory Kaake, Coquitlam (CA)

(73) Assignee: Simon Fraser University, Burnaby (CA)

( * ) Notice: Subject to any disclaimer, the term of this patent is extended or adjusted under 35 U.S.C. 154(b) by 0 days.

(21) Appl. No.: 16/618,296

(22) PCT Filed: Jun. 1, 2018

(86) PCT No.: PCT/CA2018/050663
§ 371 (c)(1),
(2) Date: Nov. 29, 2019

(87) PCT Pub. No.: WO2018/218373
PCT Pub. Date: Dec. 6, 2018

(65) Prior Publication Data
US 2020/0406294 A1   Dec. 31, 2020

Related U.S. Application Data

(60) Provisional application No. 62/514,265, filed on Jun. 2, 2017.

(51) Int. Cl.
| | |
|---|---|
| *H01L 51/00* | (2006.01) |
| *B05D 1/32* | (2006.01) |
| *B05D 3/06* | (2006.01) |
| *B05D 5/12* | (2006.01) |
| *C08L 101/12* | (2006.01) |
| *C23C 18/14* | (2006.01) |

(52) U.S. Cl.
CPC ............ *H01L 51/0007* (2013.01); *B05D 1/32* (2013.01); *B05D 3/06* (2013.01); *B05D 5/12* (2013.01); *C08L 101/12* (2013.01); *H01L 51/0014* (2013.01); *H01L 51/0023* (2013.01); *H01L 51/0026* (2013.01); *C23C 18/143* (2019.05)

(58) Field of Classification Search
CPC ............ H01L 51/0007; H01L 51/0014; H01L 51/0023; H01L 51/0026
See application file for complete search history.

(56) References Cited

U.S. PATENT DOCUMENTS

2009/0130299 A1* 5/2009 Chopra .................. H05K 3/182
427/98.4

* cited by examiner

*Primary Examiner* — Austin Murata
(74) *Attorney, Agent, or Firm* — McMillan LLP

(57) ABSTRACT

A method of depositing a lateral pattern of a deposition material onto a substrate. The method comprises fabricating a laterally patterned deposition surface on the substrate having one or more deposition regions and one or more non-deposition regions. The method comprises depositing deposition material onto the deposition regions of the deposition surface to form a deposition structure comprising deposited regions and non-deposited regions. Depositing deposition material comprises dissolving the deposition material in a solvent to form a solution, introducing the deposition surface into fluid contact with the solution, varying a temperature of the solution, varying a pressure of the solution; and selectively heating the deposition regions to temperatures greater than the temperature of the solution to cause the deposition material to precipitate from the solution and deposit onto the deposition regions.

20 Claims, 11 Drawing Sheets

METHOD OF PATTERNED DEPOSITION EMPLOYING PRESSURIZED FLUIDS AND THERMAL GRADIENTS

REFERENCE TO RELATED APPLICATIONS

This application claims priority from U.S. application No. 62/514,265 filed 2 Jun. 2017 which is hereby incorporated herein by reference. For the purposes of the United States, this application claims the benefit under 35 USC § 119 of U.S. application No. 62/514,265 filed 2 Jun. 2017.

TECHNICAL FIELD

This invention relates to methods of patterned deposition employing pressurized fluids and thermal gradients. Particular embodiments of the invention provide methods of laterally patterned deposition of conductive polymers.

BACKGROUND

Thin films of materials such as electrically conductive materials and semiconductors are often employed in the electronics industry. Common methods of fabricating thin films of materials include chemical vapor deposition and vacuum deposition.

There is a general desire to precisely fabricate or deposit laterally patterned thin films of various materials.

The foregoing examples of the related art and limitations related thereto are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One aspect of the invention comprises a method of depositing a lateral pattern of a deposition material onto a substrate. The method includes fabricating a laterally patterned deposition surface on the substrate. Traversing the laterally patterned deposition surface in at least one locally tangential direction of the laterally patterned deposition surface comprises variation between one or more deposition regions and one or more non-deposition regions. The deposition regions and the non-deposition regions differ from one another to permit selective temperature variation as between deposition regions and non-deposition regions. The method includes depositing deposition material onto the deposition regions of the deposition surface to form a deposition structure having deposited regions where deposited material overlaps the deposition surface in directions locally normal to the deposition surface and non-deposited regions free of deposited material overlapping the deposition surface in directions locally normal to the deposition surface. Depositing deposition material onto the deposition regions of the deposition surface to form the deposition structure comprises: dissolving the deposition material in a solvent to form a solution; varying a temperature of the solution to be in a vicinity of, but less than, a solubility maximum temperature at which the solubility of the deposition material in the solvent is a maximum; and selectively heating the deposition regions to localized temperatures greater than the solubility maximum temperature, to thereby cause the deposition material to precipitate from the solution and deposit onto the deposition regions.

In some embodiments, the deposition regions and the non-deposition regions differ from one another in relation to one or more physical properties which permit the selective temperature variation as between the deposition regions and the non-deposition regions. In some embodiments, the deposition regions and the non-deposition regions differ from one another in relation to at least electrical conductivity to permit the selective temperature variation as between the deposition regions and the non-deposition regions. In some embodiments, the deposition regions and the non-deposition regions differ from one another in relation to at least thermal conductivity to permit the selective temperature variation as between the deposition regions and the non-deposition regions. In some embodiments, the deposition regions and the non-deposition regions differ from one another in relation to at least electromagnetic absorptivity to permit the selective temperature variation as between the deposition regions and the non-deposition regions.

In some embodiments, fabricating the laterally patterned deposition surface on the substrate comprises selectively depositing a pattern-forming material onto one or more portions of an initial substrate surface to provide the laterally patterned deposition surface.

In some embodiments, fabricating the laterally patterned deposition surface on the substrate comprises selectively doping one or more portions of an initial substrate surface with a pattern-forming material to provide the laterally patterned deposition surface.

In some embodiments, fabricating the laterally patterned deposition surface on the substrate comprises fabricating a laterally patterned opposing surface on an initial substrate surface of the substrate, the initial surface opposite the deposition surface, wherein traversing the laterally patterned opposing surface in at least one direction tangential to the laterally patterned opposing surface comprises variation between one or more heatable regions and one or more other regions which permit selective temperature variation as between the one or more heatable regions and the one or more other regions such that selectively heating the one or more heatable regions causes the selective temperature variation as between the deposition regions and the non-deposition regions. In some embodiments, selectively heating the one or more heatable regions to cause the selective temperature variation as between the deposition regions and the non-deposition regions comprises allowing heat to travel through the substrate from the heatable regions to the deposition regions.

In some embodiments, the heatable regions and the other regions differ from one another in relation to one or more physical properties which permit selective temperature variation as between the heatable regions and the other regions. In some embodiments, the heatable regions and the other regions differ from one another in relation to at least electrical conductivity to permit the selective temperature variation as between the deposition regions and the non-deposition regions. In some embodiments, the heatable regions and the other regions differ from one another in relation to at least thermal conductivity to permit the selective temperature variation as between the deposition regions and the non-deposition regions.

In some embodiments, fabricating a laterally patterned opposing surface on the substrate comprises selectively depositing a pattern-forming material onto one or more portions of a first surface of a support and layering the opposing surface of the substrate on the first surface of the support thereby interposing the pattern forming material between the first surface of the support and the opposing surface of the substrate to fabricate a laterally patterned opposing surface on the substrate.

Another aspect of the invention provides a method of depositing a lateral pattern of a deposition material onto a substrate. The method comprises fabricating a laterally patterned deposition surface on the substrate. Traversing the laterally patterned deposition surface in at least one locally tangential direction of the laterally patterned deposition surface comprises variation between one or more deposition regions and one or more non-deposition regions. The deposition regions and the non-deposition regions differing from one another to permit selective temperature variation as between deposition regions and non-deposition regions. Fabricating the laterally patterned deposition surface on the substrate may comprise fabricating a laterally patterned opposing surface on an initial substrate surface of the substrate, the initial surface opposite the deposition surface. Traversing the laterally patterned opposing surface in at least one direction tangential to the laterally patterned opposing surface comprises variation between one or more heatable regions and one or more other regions which permit selective temperature variation as between the one or more heatable regions and the one or more other regions such that selectively heating the one or more heatable regions causes the selective temperature variation as between the deposition regions and the non-deposition regions. Fabricating the laterally patterned deposition surface on the substrate also comprises selectively heating the one or more heatable regions of the laterally patterned opposing surface to thereby cause the selective temperature variation as between the deposition regions and the non-deposition regions of the deposition surface. The method comprises depositing deposition material onto the deposition regions of the deposition surface to form a deposition structure comprising deposited regions where deposited material overlaps the deposition surface in directions locally normal to the deposition surface and non-deposited regions free of deposited material overlapping the deposition surface in directions locally normal to the deposition surface. Depositing deposition material onto the deposition regions of the deposition surface to form the deposition structure comprises: dissolving the deposition material in a solvent to form a solution; varying a temperature of the solution to be in a vicinity of, but less than, a solubility maximum temperature at which the solubility of the deposition material in the solvent is a maximum; and selectively heating the deposition regions to localized temperatures greater than the solubility maximum temperature, to thereby cause the deposition material to precipitate from the solution and deposit onto the deposition regions.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DESCRIPTION

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive sense.

One aspect of the invention provides a method of depositing a deposition material onto a deposition surface of a substrate to thereby provide a deposited structure having laterally patterned: (1) deposited regions, where deposited material overlaps the deposition surface in directions locally normal to the deposition surface; and (2) non-deposited regions, free of deposited material overlapping the deposition surface in directions locally normal to the deposition surface. The method comprises fabricating a laterally patterned deposition surface on the substrate. The laterally patterned deposition surface comprises a surface wherein traversing the surface on at least one locally tangential direction comprises variation between one or more deposition regions and one or more non-deposition regions, where the deposition regions and the non-deposition regions differ from one another in a manner which permits selective temperature variation as between deposition regions and non-deposition regions. Deposition regions and non-deposition regions may differ from one another in relation to one or more physical properties which permit selective temperature variation as between deposition regions and non-deposition regions. Non-limiting examples of such physical properties include: differences in thermal conductivity; differences in electrical conductivity; differences in electromagnetic absorptivity; and/or the like.

The method comprises depositing deposition material onto the deposition regions of the deposition surface. Depositing deposition material onto the deposition regions may comprise: dissolving the deposition material in a solvent to form a solution; introducing the deposition surface into fluid contact with the solution, varying a temperature and increasing a pressure of the solution; and selectively heating the deposition regions to temperatures greater than the temperature of the solution to cause the deposition material to precipitate from the solution and deposit onto deposition regions.

In some embodiments, deposition material 40 may comprise one or more polymers and/or oligomers (including those with conducting or semiconducting properties), semiconducting polymers, semiconductor nanocrystals, metal nanostructures, and/or carbon nanotubes. Materials like graphene or other layered materials like $MoS_2$ could be employed as deposition material 40 provided that a suspension of such materials can be prepared. In some embodiments, deposition material 40 may comprise a semiconducting polymer commonly referred to as PBTTT-C14 with the following structure:

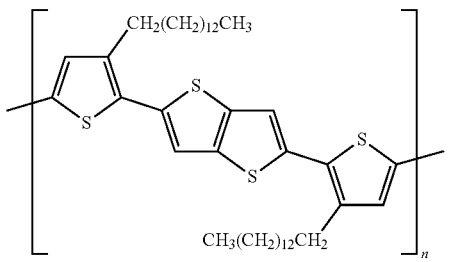

Figure 1A:
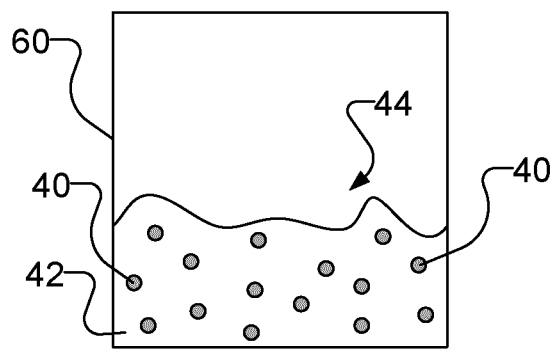
FIG. 1A is a schematic depiction of a material dissolving in a solvent to form a solution according to one aspect of the invention.

FIG. 1A shows deposition material 40 dissolved in a pressurized solvent 42 to form a solution 44 in a vessel 60. In some embodiments, as part of method 100 (or other methods described herein) material 40 may be purified before or during deposition onto a substrate 50. For example, deposition material 40 may be purified according to one or more differences in its chemical structure, molecular weight and/or the crystallinity of its chemical structure by processing deposition material 40 in pressurized solvent 42 as part of method 100. A result of such purification can be seen by studying the absorption data in FIG. 4A where the shift towards a larger absorption in longer wavelengths indicates an increase in the average molecular weight and/or conjugation length of dissolved deposition material 40. Thus a useful aspect of the method 100 (and other methods described herein) is the ability to purify deposition material 40 deposited during method 100.

Figure 1B:
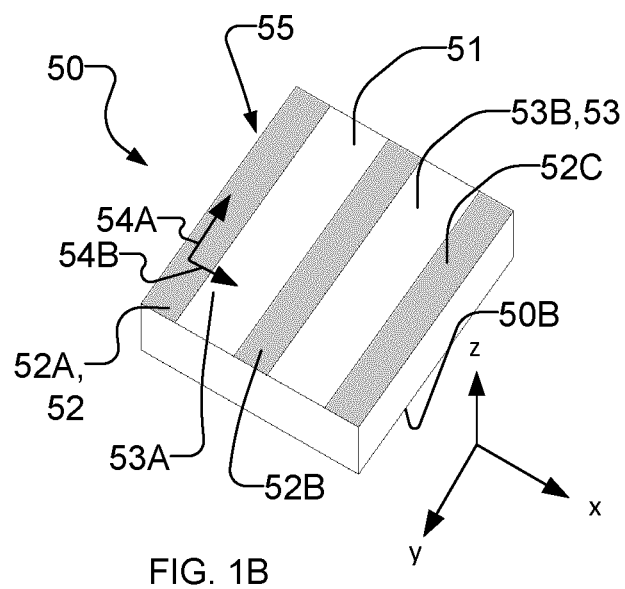
FIG. 1B is a schematic depiction of a substrate and its laterally patterned deposition surface according to one aspect of the invention.
Figure 1C:
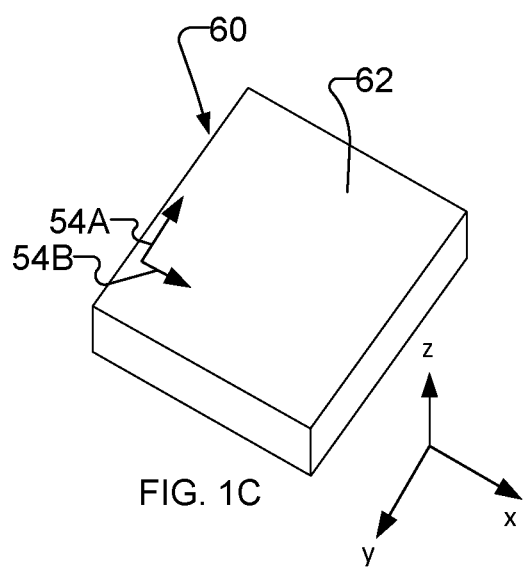
FIG. 1C is a schematic depiction of a substrate according to one embodiment of the invention.

FIG. 1B is a schematic depiction of a substrate 50 and its deposition surface 51. Deposition surface 51 is laterally patterned. In this disclosure, unless the context dictates otherwise, a laterally patterned deposition surface (like deposition surface 51) comprises a surface wherein traversing the surface on at least one locally tangential direction 54 comprises variation between one or more deposition regions (e.g. deposition regions 52A, 52B, 52C (collectively, deposition regions 52) of the FIG. 1B embodiment) and one or more non-deposition regions (e.g. non-deposition regions 53A, 53B (collectively, non-deposition regions 53) of the FIG. 1B embodiment). Deposition regions 52 and non-deposition regions 53 differ from one another in a manner which permits selective temperature variation as between deposition regions 52 and non-deposition regions 53. Deposition regions 52 and non-deposition regions 53 may differ from one another in relation to one or more physical properties which permit selective temperature variation as between deposition regions 52 and non-deposition regions 53. Non-limiting examples of the different physical properties between deposition regions 52 and non-deposition regions 53 include: differences in thermal conductivity; differences in electrical conductivity; differences in electromagnetic absorptivity; and/or the like.

Substrate 50 of the illustrated embodiment of FIG. 1B comprises a laterally patterned deposition surface 51 onto which deposition material 40 may be deposited, as described in more detail below. In the particular case of the FIG. 1B embodiment, laterally patterned deposition surface 51 is generally planar and extends in the X and Y directions shown in FIG. 1B with a normal in the Z direction. In general, laterally patterned deposition surface 51 onto which deposition material will be deposited need not be planar. In some embodiments, laterally patterned deposition surface 51 may comprise curvature and/or discontinuities. In such non-planar embodiments, the directions X and Y can be generalized to be non-parallel and non-anti-parallel directions 54A, 54B which (at any point on laterally patterned deposition surface 51) are locally tangential to laterally patterned deposition surface 51 or which (at any point on laterally patterned deposition surface 51) are orthogonal to a vector that is normal to laterally patterned deposition surface 51. These locally tangential directions 54A, 54B may be referred to herein as tangential directions 54A, 54B (collectively, tangential directions 54). It will be appreciated that where laterally patterned deposition surface 51 comprises curvature or discontinuities, the orientation of these tangential directions 54 will vary as between particular locations on laterally patterned deposition surface 51. For brevity, the adjective lateral may be omitted from describing a laterally patterned surface. However, unless the context dictates otherwise, use of the word patterned in this disclosure should be interpreted to mean laterally patterned.

Patterned deposition surface 51 shown in the illustrative example of FIG. 1B comprises an arrangement of deposition regions 52 and non-deposition regions 53 in a lateral pattern 55. Pattern 55 may comprise any suitable lateral pattern that exhibits variation between one or more deposition regions 52 and one or more non-deposition regions 53 when the deposition surface is traversed in a tangential direction 54. For example, in the illustrated embodiment of FIG. 1B where deposition surface 51 is planar, pattern 55 varies between deposition regions 52 and non-deposition regions in the X direction (tangential direction 54B). Pattern 55 is not limited to the striped arrangement shown in the illustrated embodiments herein. For example, pattern 55 may comprise a checkered pattern, spiral pattern, hatched pattern, dotted pattern, and patterns useful to the formation of electronic circuitry for various devices.

Substrate 50 may comprise any suitable material on which a patterned deposition surface 51 (having the properties described above) can be fabricated and which does not dissolve or melt during method 100. In some embodiments, substrate 50 may be glass. In some embodiments, substrate 50 is optically transparent. In some embodiments, substrate 50 is a flexible material such as a polymer or a fabric. In some embodiments, substrate 50 comprises one or more of a glass, a ceramic, a semiconductor, an elastomer, a plastic, a fabric, paper, wood, leather, carbon fiber, a graphitic material, etc.

Figure 2:
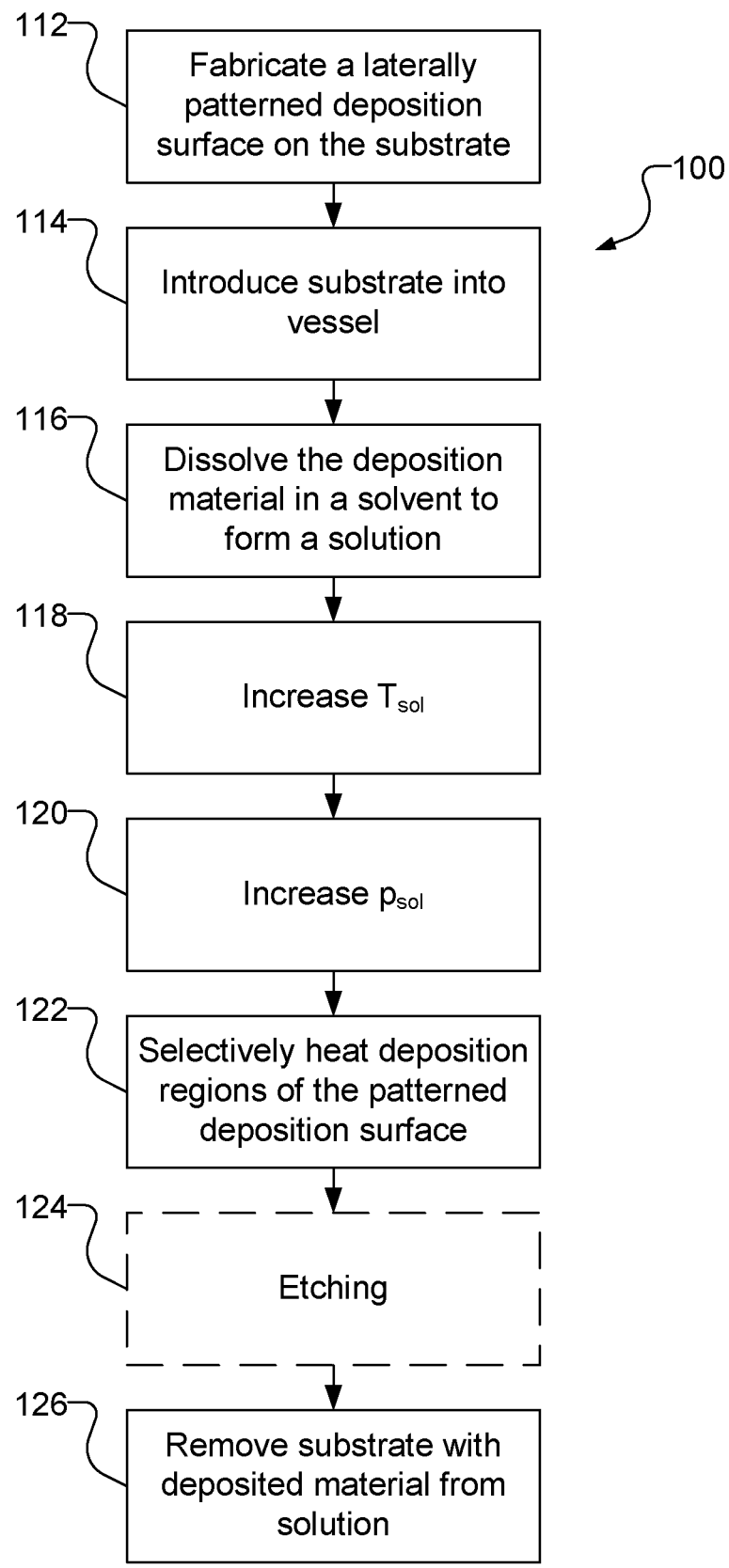
FIG. 2 is a block diagram of a method of depositing a material onto a substrate according to one aspect of the invention.

FIG. 2 is a block diagram of a method 100 of depositing a deposition material 40 onto a patterned deposition surface 151 of a substrate 150 according to one aspect of the invention.

Figure 3A:
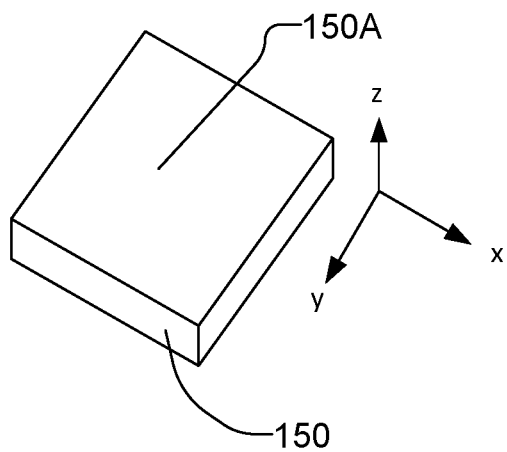
FIG. 3A is a schematic depiction of a substrate according to one embodiment of the invention.
Figure 3B:
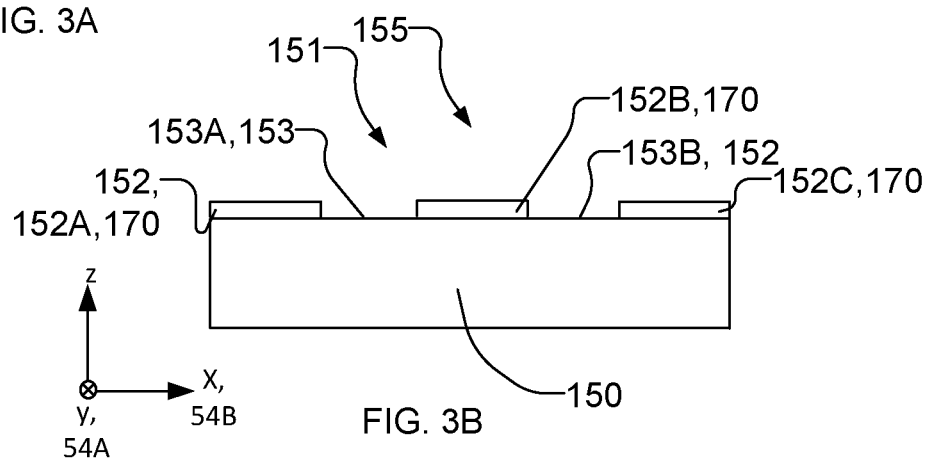
FIG. 3B is a schematic cross-section depiction of a substrate and its laterally patterned deposition surface according to one aspect of the invention wherein the laterally patterned depositions surface is formed on an initial substrate surface by coating pattern-forming material onto the initial substrate surface.

Method 100 starts at block 112 where a laterally patterned deposition surface 151 is fabricated on a substrate 150. FIGS. 3A and 3B illustrate a method for fabricating a patterned deposition surface 151 on a substrate 150 according to a particular exemplary embodiment. FIG. 3A shows a substrate 150 comprising an initial substrate surface 150A that is not patterned. Then, a pattern-forming material 170 is selectively deposited onto initial substrate surface 150A to provide a patterned deposition surface 151 comprising deposition regions 152A, 152B, 152C (collectively, deposition regions 152) and leaving initial substrate surface 150A exposed in non-deposition regions 153A, 153B (collectively, non-deposition regions 153) in a lateral pattern 155, as shown in FIG. 3B. Lateral pattern 155 may be similar to lateral pattern 55. Patterned deposition surface 151 of the FIG. 3B embodiment differs from patterned deposition surface 51 of the FIG. 1B embodiment in that patterned deposition surface 151 is not planar and may have some normal (e.g. Z) direction differences as between deposition regions 152 and non-deposition regions 153. In the case of the illustrated embodiment of FIG. 3B, the selectively added pattern-forming material 170 may comprise a resistive material that conducts electricity to permit a selective increase in temperature of deposition regions 152 relative to non-deposition regions 153. In some embodiments, it is possible that a selectively deposited pattern-forming material (e.g. a thermally insulating pattern-forming material) could be used to create non-deposition regions on substrate 150, leaving the initial substrate surface 150A exposed in deposition regions.

Depositing a pattern-forming material onto an initial substrate surface is not the only way to fabricate a laterally patterned deposition surface. Other techniques for fabricating a laterally patterned deposition surface include other techniques to selectively change physical characteristics of particular regions of the substrate to thereby create deposition regions and/or to thereby create non-deposition regions. Non-limiting examples of such techniques include, for example, doping particular regions of a substrate to change a physical property of the doped regions, selectively exposing particular regions of a substrate to energy (e.g. radiation energy), electrons, neutrons, ions etc. to change a physical property of the exposed regions, selectively creating localized chemical reactions in particular regions of a substrate to change a physical property of the reacted regions, selectively removing particular regions of a substrate to thereby change a physical property of the substrate where regions have been removed, combinations of these techniques and/or the like. Such physical properties could, for example, comprise porosity, density, crystal structure, conductivity (electrical and/or thermal), absorptivity, etc. Such techniques may, in some cases, result in generally planar patterned deposition surfaces (like deposition surface 51 of FIG. 1B) and may, in some cases, result in patterned deposition surfaces that have normal direction variation (like deposition surface 151 of FIG. 3B).

In one particular embodiment, pattern forming material 170 comprises an electrically conductive material that generates heat when current passes therethrough (e.g. resistive material). In some such embodiments, pattern-forming material 170 may comprise any material capable of generating sufficient resistive heat, such as, for example, indium tin oxide, doped silicon, carbon, copper, gold, silver, tungsten, nickel-chromium alloy, or any other metal, metal alloy, semiconductor, or semimetal. The application of pattern-forming material 170 to substrate 150 can be achieved using any suitable selective material deposition or material patterning method, such as but not limited to photolithography, physical vapor deposition, ion implantation, atomic layer deposition, chemical vapor deposition, spin coating, printing of chemical precursors, combinations of these techniques and/or the like. Pattern 155 of pattern-forming material 170 may be achieved by, for example, photolithography, through use of shadow masks, printing processes, or imprinting via elastomeric stamps or phase-separated block polymers.

Returning to method 100 (FIG. 2), the remainder of method 100 is described in relation to laterally patterned deposition surface 151 (FIG. 3B), it being appreciated that laterally patterned deposition surface 51 (FIG. 1B) could be substituted for laterally patterned deposition surface 151. At block 114, substrate 150 with patterned deposition surface 151 is introduced into a vessel 60 (e.g. vessel 60 shown in FIG. 1A) such that patterned deposition surface 151 is exposed to solution 44 in vessel 60. In some embodiments, substrate 150 may be arranged as a wall of vessel 60 such that patterned deposition surface 151 provides a cavity-defining surface of vessel 60 such that patterned deposition surface 151 is exposed to solution 44 in vessel 60. In other embodiments, substrate 150 is suspended or supported by a bracket or the like within vessel 60 such that patterned deposition surface 151 is exposed to solution 44 in vessel 60. In some embodiments, substrate 150 merely rests on one or more interior surfaces of vessel 60 such that patterned deposition surface 151 is exposed to solution 44 in vessel 60.

Method 100 continues at block 116, where deposition material 40 and solvent 42 are introduced into vessel 60 to form solution 44. A sufficient volume of deposition material 40 and solvent 42 may be introduced into vessel 60 such that solution 44 is in fluid contact with patterned deposition surface 151. In some embodiments, substantially all of patterned deposition surface 151 is in fluid contact with solution 44. In other embodiments, less than all of patterned deposition surface 151 is in fluid contact with solution 44. In some embodiments, substantially all (e.g. greater than 90%) of the surface area of substrate 150 is in fluid contact with solution 44.

In some embodiments, the selection of solvent 42 may be at least partially dependent on the choice of deposition material 40 to be deposited. The selection of solvent 42 may affect the amount and molecular weight of deposition material 40 that can be dissolved in solvent 42 and the temperature range for deposition. In some embodiments, solvent 42 is selected such that deposition material 40 has non-negligible solubility in solvent 42. In some embodiments, solvent 42 is selected such that solubility of deposition material 40 in solvent 42 varies with the temperature of solution 44. In some embodiments, solvent 42 is selected such that at certain temperatures, solubility of deposition material 40 in solvent 42 decreases with increasing temperature of solution 44 The temperature at which deposition material 40 becomes less soluble in solvent 42 with increasing temperature is preferably lower than the decomposition temperature of deposition material 40 to prevent decomposition of deposition material 40 before deposition of deposition material 40 onto substrate 150.

Various solvents may be employed as solvent 42. Solvent 42 may be limited to those solvents in which deposition materials 40 of interest have non-negligible solubility. It may be desirable that solvent 42 be stable at the temperature of deposition or higher and unreactive with deposition material 40. In some embodiments, solvent 42 comprises low boiling point hydrocarbons, hydrofluorocarbons, carbon dioxide, water and sulfur hexafluoride. In some embodiments, the solubility of deposition material 40 may be improved by the use of co-solvents. In such cases, limitations on the co-solvent are significantly less prohibitive. In some embodiments, solvent 42 comprises pentane or a mixture of pentane and toluene. In some embodiments, it may be desirable to remove oxygen when using flammable solvents under pressure.

In some embodiments, solvent 42 may comprise one or more of: butane, propane, pentane, hexane, heptane, octane, chloromethane, dichloromethane, trichloromethane, tetrachloromethane, chloroethane, dichloroethane, trichloroethane, tetrachloroethane, pentachloroethane, hexachloroethane, fluoromethane, difluoromethane, trifluoromethane, tetrafluoromethane, acetaldehyde, allene, 1,1-Bis(difluoromethoxy)-1,2,2,2-tetrafluoroethane, Bis(difluoromethyl) ether, Bis(2,2,2-trifluoroethyl) ether, Bromochlorodifluoromethane, Bromodifluoromethane, bromotrifluoromethane, 1,3 butadiene, 1-chloro 1,1-difluoroethane, 1-Chloro-2,2-difluoroethene, Chlorodifluoromethane, 2-Chloro-2-(difluoromethoxy)-1,1,1-trifluoroethane, chloroethene, Chloropentafluoroethane, 1-Chloro-1,2,2,2-tetrafluoroethane, 2-Chloro-1,1,1-trifluoroethane, Chlorotrifluoroethene, 2-Chloro-1,1,2-trifluoroethyl, difluoromethyl ether, chlorotrifluromethane, Cyclopropane, dichlorodifluoromethane, 1,1-Dichloro-1-fluoroethane, Dichlorofluoromethane, 1,2-Dichlorohexafluoropropane, 1,1-Dichloro-1,2,2,2-tetrafluoroethane 1,2-Dichloro-1,1,2,2-tetrafluoroethane, 1,2-Dichloro-1,1,2-trifluoroethane, 2,2-Dichloro-1,1,1-trifluoroethane Diethyl ether, 1,1 difluoroethane, 1,1-difluorethene, 3-Difluoromethoxy-1,1,1,2,2-pentafluoropropane, 2-(Difluoromethoxy)-1,1,1-trifluoroethane, dimethoxymethane, 3-Difluoromethoxy-1,1,1,2,2-pentafluoropropane 2-(Difluoromethoxy)-1,1,1-trifluoroethane, 1,1,1,2,2,3,3-Heptafluoropentan-4-one, 1,1,1,2,3,3,3-Heptafluoropropane, 1,1,1,2,4,4,4-Heptafluoro-2-trifluoromethoxybutane, 1,1,1,2,2,3,3-Heptafluoro-3-(trifluoromethoxy) propane, Hexafluoroacetylacetone, hexafluoroethane, 1,1,1,3,3,3-Hexafluoro-2-methoxy-2-(trifluoromethyl)propane, 1,1,1,2,3,3-Hexafluoropropane, 1,1,1,3,3,3-Hexafluoropropane, Isobutane, perfluorohexane, sulfur hexafluoride, carbon dioxide, xenon, nitrous oxide, nitric oxide, water, krypton, benzene, toluene, chlorobenzene, dichlorobenzene, trichlorobenzene, phenol, dimethylbenzene, trimethylbenzene, fluorobenzene, difluorobenzene, trifluorobenzene, chlorofluorobenzene, dichlorofluorobenzene, chlorodifluorobenzene, chlorotoluene, fluorotoluene, methanol, ethanol, isopropanol, acetone, acetonitrile, perfluoropentane, decafluropentane, perfluorocyclopentane, perfluorobutane, perfluorocyclobutane, or any mixture thereof.

Referring back to FIG. 2, method 100 continues at block 118 where the temperature, $T_{sol}$, of solution 44 is varied to increase the solubility of deposition material 40 in solvent 42. By way of non-limiting example, the temperature, $T_{sol}$, of solution 44 may be increased by applying heat to the walls of vessel 60 or by a heating element (not shown) located in the cavity of vessel 60. In some embodiments, increasing temperature, $T_{sol}$, of solution 44 may increase the solubility of deposition material 40 in solvent 42 as can be seen from FIGS. 4A and 4B. This may not always be the case for any combination of deposition material 40 and solvent 42. For example, maximum solubility of deposition material 40 in solvent 42 may occur at various temperatures (including ambient temperature).

At block 120 of method 100, the pressure, $p_{sol}$, of solution 44 is increased. Block 120 may occur simultaneously or in series with block 118. In some embodiments, the pressure, $p_{sol}$, of solution 44 and the temperature, $T_{sol}$, of solution 44 may be varied to achieve a temperature that is in a vicinity of a solubility maximum temperature at which the solubility of deposition material 40 in solvent 42 is a maximum, such that a further increase (or decrease as the case may be) in temperature, $T_{sol}$, of solution 44 would lead to precipitation of deposition material 40 out of solution 44. In other embodiments, the pressure, $p_{sol}$, of solution 44 and the temperature, $T_{sol}$, of solution 44 may be chosen such that $T_{sol}$ is lower than the maximum solubility temperature at which the maximum solubility of deposition material 40 in solvent 42 occurs.

In some embodiments, a piston that is connected to the vessel is driven (manually or automatically) into the cavity of the vessel to increase the pressure, $p_{sol}$. Pressure could also be generated by high pressure pumps including piston and dual head pumps, or any other technology commonly used in the pressurization of sealed containers.

Figure 4A:
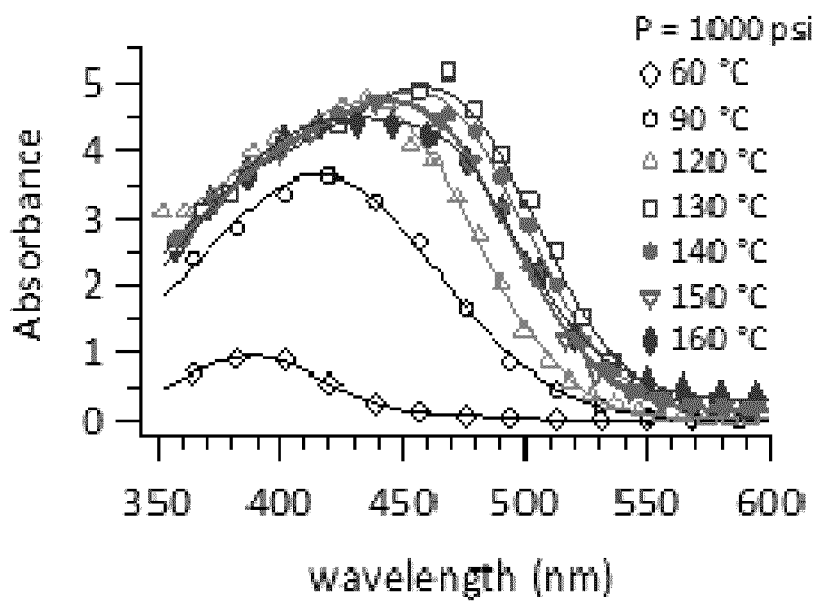
FIG. 4A is a plot of absorbance as a function of wavelength for various temperatures.
Figure 4B:
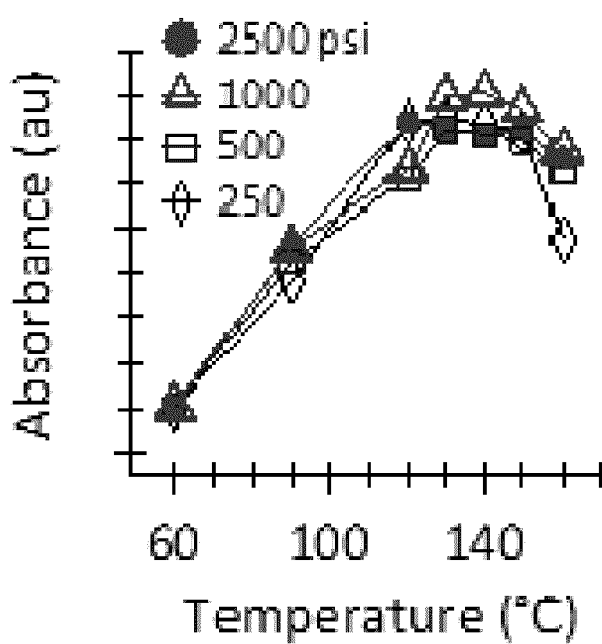
FIG. 4B is a plot of integrated absorbance as a function of temperature for various pressures.

FIGS. 4A and 4B illustrate desirable solubility characteristics of deposition material 40 in solvent 42. UV-Vis absorption spectra were used to measure the amount of dissolved deposition material 40. Increasing absorbance values indicate an increase in the amount of dissolved deposition material 40. FIG. 4B displays the integrated absorbance as a function of temperature and pressure. The value of the integrated absorbance indicates the amount of dissolved deposition material 40 in solvent 42.

Figure 3C:
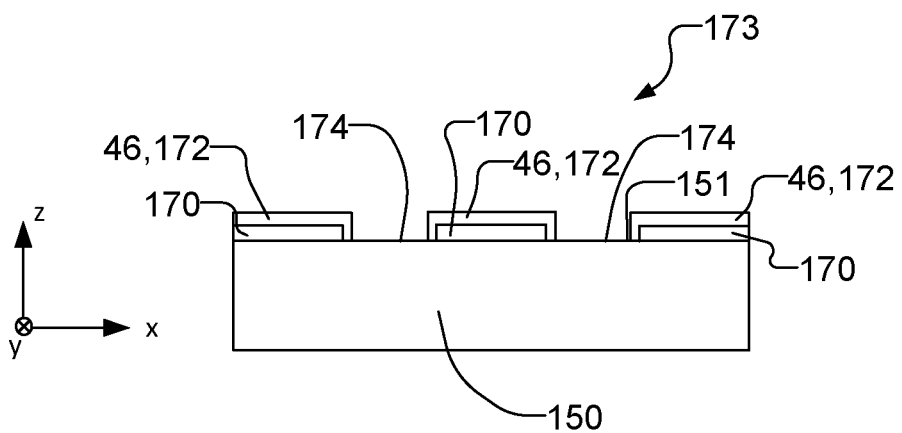
FIG. 3C is a schematic depiction of a laterally patterned deposited structure formed by depositing material onto the deposition surface of FIG. 3B.

At block 122 of method 100, the deposition regions 152 of patterned deposition surface 151 are heated to a temperature greater than the temperature of a bulk of solution 44. In some embodiments, deposition regions 152 are heated by conducting electrical current through resistive deposition regions. In some embodiments, deposition regions 152 are heated by thermal contact of thermally conductive deposition regions 152 with a heat source. In some embodiments, deposition regions 152 are heated by application of radiation energy to absorptive deposition regions 152. Heating deposition regions 152 causes a localized increase in the temperature of solution 44 in a vicinity of deposition regions 152, which in turn reduces the solubility of deposition material 40 in solvent 42 and causes a corresponding precipitation of deposition material 40 out of solvent 42 and deposition of deposition material 40 onto deposition regions 152. In some embodiments, the block 122 increase in temperature of the deposition regions 152 increases the temperature of the deposition regions 152 to localized temperatures greater than the solubility maximum temperature of deposition material 40 in solvent 42. In some embodiments, the block 122 increase in temperature of the deposition regions 152 increases the temperature of the deposition regions 152 more than 10° C. relative to the bulk of solution 44. In some embodiments, this temperature difference is greater than 20° C. In some embodiments, this temperature difference is greater than 30° C. The rate of deposition of deposition material in block 122 may be correlated with this temperature difference—i.e. larger temperature differences result in faster deposition rates. The desired temperature increase of the deposition regions 152 (relative to the bulk of solution 44) may depend on the particular choice of solvent 42 and deposition material 40. Referring to FIG. 3C, this deposition of deposition material 40 onto deposition regions 152 forms a deposited structure 173 comprising: deposited regions 172, where deposited material 46 overlaps deposition surface 151 in directions locally normal to deposition surface 151; and non-deposited regions 174, free of deposited material 46 overlapping deposition surface 151 in directions locally normal to deposition surface 151.

The decrease in the solubility of deposition material 40 (e.g. semiconducting polymer) with increasing temperature, $T_{sol}$, was demonstrated by the collection of UV-Vis absorption spectra as shown in FIG. 4A. FIG. 4A shows absorbance as a function of temperature at a pressure of 1000 psi. At the lowest temperatures (e.g. 60° C.-130° C.), the absorbance increases with temperature as more deposition material 40 (e.g. semiconducting polymer) becomes dissolved in solvent 42. At the highest temperatures (e.g. 130° C.-160° C.), the absorbance decreases with temperature, indicating that the concentration of deposition material 40 (e.g. semiconducting polymer) dissolved in solvent 42 is decreasing.

This decrease in solubility of deposition material 40 in solvent 42 at higher temperatures is more easily seen by integrating the UV-Vis absorption spectra. FIG. 4B shows the integrated absorbance as a function of temperature for a variety of pressures. A maximum absorbance is observed around 130° C. After approximately 130° C., the integrated absorbance decreases as temperature increases, indicating that material has precipitated out of solution.

Therefore, by heating deposition regions 152 of substrate 150 in contact with a pressurized and heated solution 44 to a temperature where the solubility of deposition material 40 in solvent 42 decreases (such as over 130° C. in the example shown in FIG. 4B), deposition material 40 can be caused to precipitate from solution 44 onto deposition regions 152 of deposition surface 151 to form deposited structure 173.

Selectively heating deposition regions 152 of deposition surface 151 may be achieved in any suitable way. For example, in some embodiments, current is driven through a resistive deposition region 152. By passing current through deposition region 152, deposition regions 152 may be sufficiently heated to precipitate deposition material 40 out of solution 44 to thereby deposit deposition material 40 on deposition surface 151, as schematically depicted in FIG. 3C. In some embodiments, deposition region 152 is additionally or alternatively thermally conductive and is thermally contacted to a heat source which sufficiently heats deposition region 152 to thereby deposit deposition material 40 on deposition surface 151. In some embodiments, deposition region 152 is additionally or alternatively absorptive and is exposed radiation which sufficiently heats deposition region 152 to thereby deposit deposition material 40 on deposition surface 151.

Further processing steps may be employed as desired. For example, a further optional etching step (e.g. block 124 of method 100) to remove unwanted deposition material 40 from substrate 150 may be provided to achieve a desired pattern. Etching may be achieved by changing temperature $T_{sol}$ and/or pressure $p_{sol}$ and/or by changing the pattern of heating to facilitate dissolution of unwanted deposited material 46 from substrate 150 back into solution 44.

After sufficient deposition of deposition material 40 onto substrate 152 is achieved as desired and optional etching at block 124, substrate 150 may be removed from solution 44 at block 122. Removing substrate 150 from solution 44 may involve reducing the pressure of vessel 60 and draining solution 44 from vessel 60. Solution 44 may be drained into an ambient environment or a secondary vessel having a pressure higher than ambient pressure but lower than the pressure inside vessel 60. In some embodiments, solution 44 may be drained into a vacuum to increase the rate at which solution 44 is drained from vessel 60.

Figure 5A:
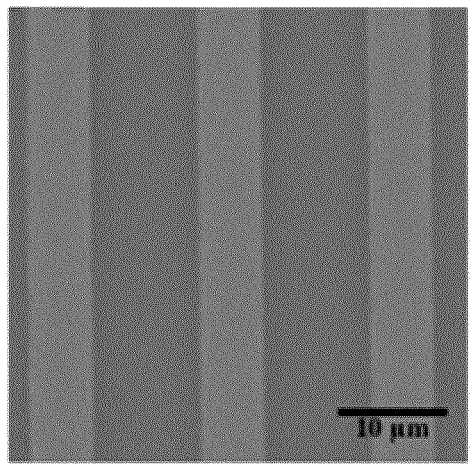
FIG. 5A is an image from a scanning electron microscope demonstrating 10 micron linewidths of material deposited on a substrate using resistive heating.
Figure 5B:
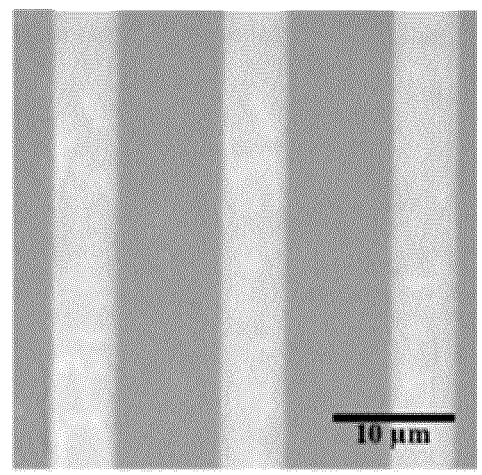
FIG. 5B is an image from an optical microscope demonstrating 10 micron linewidths of material deposited on a substrate using resistive heating.

FIG. 5A shows experimental results demonstrating 100 micron linewidths of deposited material 46 using an electrically conductive, but resistive deposited material 170 (as shown in FIG. 3B) and resistive heating as seen by a scanning electron microscope. FIG. 5B shows experimental results demonstrating 100 micron linewidths of deposited material 46 using an electrically conductive, but resistive deposited material 170 (as shown in FIG. 3B) and resistive heating as seen by an optical microscope.

Figure 6A:
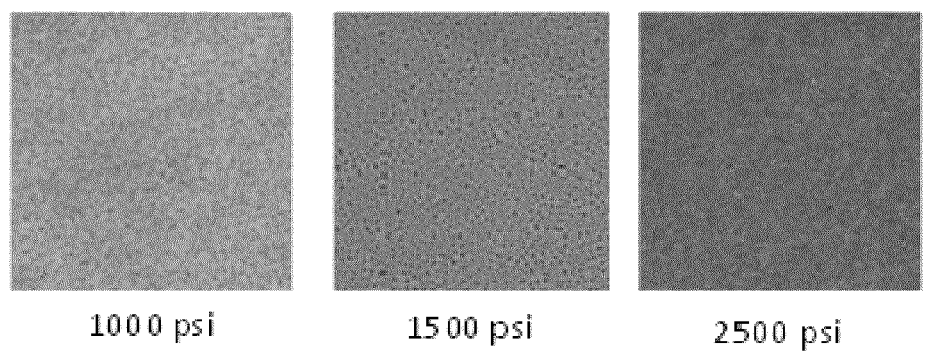
FIG. 6A depicts optical microscope images of organic films deposited onto a resistively heated substrate at three different pressures.
Figure 6B:
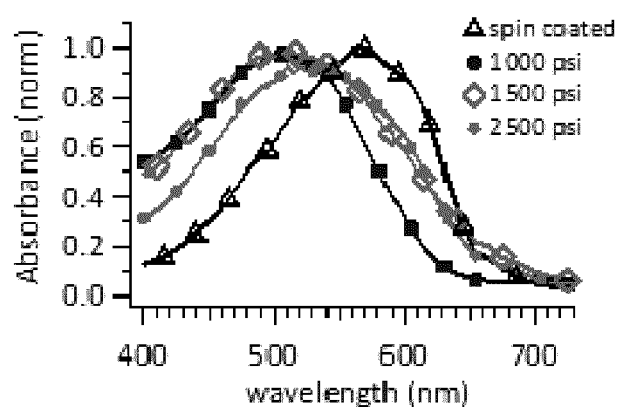
FIG. 6B is a plot of absorption as a function of wavelength of various films.

FIG. 6A shows optical microscope images of organic films deposited onto a resistively heated substrate at three different pressures. The substrate was a glass slide coated on one side with indium tin oxide. FIG. 6B shows UV-Vis absorption data of the films with a film deposited via spin coating for comparison.

In accordance with some aspects of the invention fabricating the laterally patterned deposition surface on the substrate comprises fabricating a laterally patterned opposing surface on the substrate, wherein the opposing surface is on a surface of the substrate that opposes an initial deposition surface. Traversing the laterally patterned opposing surface in at least one direction tangential to the laterally patterned opposing surface comprises variation between one or more heatable regions and one or more other regions, which permit selective temperature variation as between the one or more heatable regions and the one or more other regions. Causing this selective temperature variation between the one or more heatable regions and the one or more other regions causes heat to transfer through the substrate to the deposition surface and may in turn create the laterally patterned deposition surface, which may be used to create the deposited structure as described herein. As with the laterally patterned deposition surface, the laterally patterned opposing surface may comprise heatable regions and other regions which differ from one another in relation to one or more physical properties which permit selective temperature variation as between the heatable regions and the other regions. Non-limiting examples of such physical properties include: differences in thermal conductivity; differences in electrical conductivity; differences in electromagnetic absorptivity; and/or the like.

Another aspect of the invention provides a method for depositing a deposition material onto a deposition surface of a substrate to thereby provide a deposited structure having laterally patterned: (1) deposited regions, where deposited material overlaps the deposition surface in directions locally normal to the deposition surface; and (2) non-deposited regions, free of deposited material overlapping the deposition surface in directions locally normal to the deposition surface. The method comprises fabricating a laterally patterned opposing surface on the substrate wherein the opposing surface is on a surface of the substrate that opposes an initial (e.g. pre-patterned) deposition surface. The laterally patterned opposing surface is characterized in that traversing the laterally patterned opposing surface in at least one direction tangential to the laterally patterned opposing surface comprises variation between one or more heatable regions and one or more other regions, which permit selective temperature variation as between the one or more heatable regions and the one or more other regions. The laterally patterned opposing surface may comprise heatable regions and other regions which differ from one another in relation to one or more physical properties which permit selective temperature variation as between the one or more heatable regions and the one or more other regions. Non-limiting examples of such physical properties include: differences in thermal conductivity; differences in electrical conductivity; differences in electromagnetic absorptivity; and/or the like.

The method comprises causing this selective temperature variation between the one or more heatable regions and the one or more other regions which in turn causes heat to transfer through the substrate to the deposition surface and may in turn create one or more deposition regions on the deposition surface in locations generally opposed to the one or more heatable regions. The method also comprises depositing deposition material onto the deposition regions of the deposition surface. Depositing deposition material onto the deposition regions may comprise: dissolving the deposition material in a solvent to form a solution; introducing the deposition surface into fluid contact with the solution, varying a temperature and increasing a pressure of the solution; and selectively heating the deposition regions to temperatures greater than the temperature of the solution to cause the deposition material to precipitate from the solution and deposit onto deposition regions.

Figure 7:
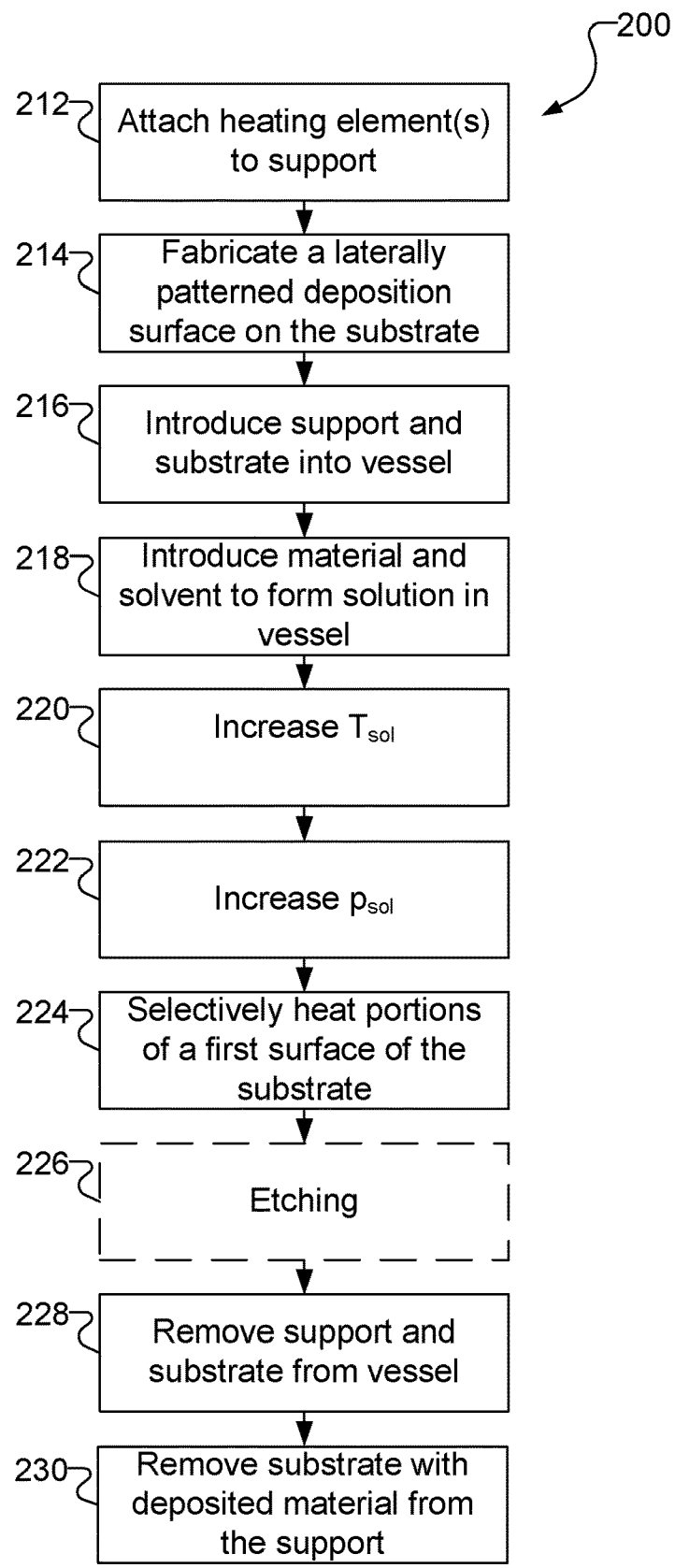
FIG. 7 is a block diagram of a method of depositing a material onto a substrate according to another aspect of the invention.

FIG. 7 is a block diagram of a method 200 of depositing a deposition material 40 on deposition regions 252 of a deposition surface 251 of substrate 250 according to an aspect of the invention.

Figure 8A:
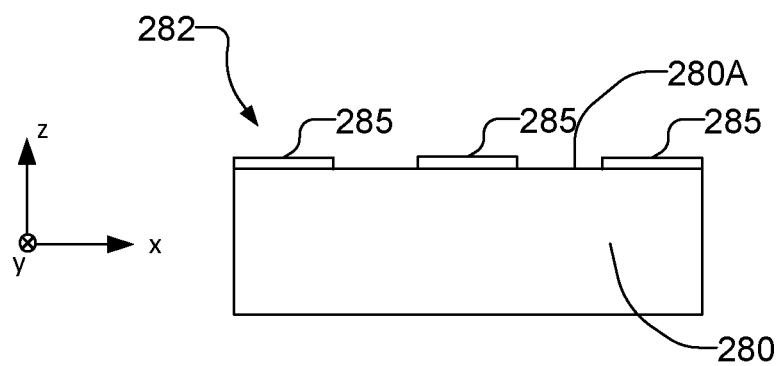
FIG. 8A is a schematic depiction of a cross-section of a support according to one embodiment of the invention.

Method 200 starts at block 212 where one or more regions of pattern-forming material 285 are fabricated on a first surface 280A of a support 280 as shown schematically in FIG. 8A. Support 280 may comprise, glass, silicon, sapphire, alumina, polyimides, per and polyfluoroalkyl substances, mica, titanium dioxide, zinc oxide, aerogel materials. In some embodiments, support 280 comprises any glass, ceramic, plastic or mineral that does not melt or dissolve during deposition, has a low enough thermal conductivity to permit the formation of temperature gradients and possesses appropriate mechanical rigidity either to enable the deposition of a material onto it, or to place it in thermal contact with another material. In some embodiments, support 280 may be substantially similar to, and have properties similar to those of, substrate 50.

Pattern-forming material region(s) 285 may comprise any suitable heat conducting materials (e.g. metals and/or alloys thereof). In some embodiments, pattern forming material region(s) 285 may comprise electrically conductive (but resistive) material(s) that produce heat when a current is driven therethrough. In some embodiments, pattern forming material region(s) 285 may be substantially similar to, and may comprise properties similar to, pattern-forming material 170 described elsewhere herein. By way of non-limiting example, pattern forming material region(s) 285 may comprise metals and metal alloys, glass, silicon or other semiconductors, plastics, or ceramics shaped into plates, meshes, tubes, spirals or otherwise. Pattern forming material region(s) 285 may be fabricated on support 280 by any suitable technique that permits patterning of such material. For example, pattern forming material region(s) 285 may be fabricated on support 280 using any of the techniques described herein for pattern forming material 170. The application of pattern forming material region(s) 285 to support 280 can be achieved using any suitable selective material deposition or material patterning method, such as but not limited to photolithography, physical vapor deposition, ion implantation, atomic layer deposition, chemical vapor deposition, spin coating, printing of chemical precursors, combinations of these techniques and/or the like. As an example, tungsten or gold heating element traces may be photolithographically patterned onto a silicon wafer support 280 to provide pattern forming material region(s) 285.

Figure 8B:
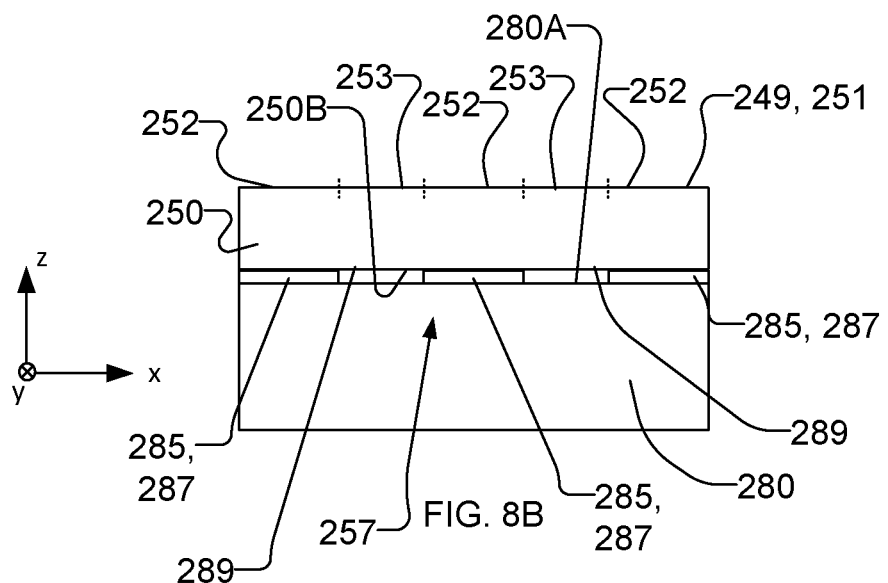
FIG. 8B is a schematic depiction of a cross-section of a substrate and its laterally patterned deposition surface layered on a support according to one embodiment of the invention.

Block 214 comprises fabricating a laterally patterned deposition surface 251 on a substrate 250. In the illustrated embodiment, block 214 comprises forming a laterally patterned opposing surface. Substrate 250 is layered onto support 280, thereby interposing pattern forming material region(s) 285 between surface 280A of support 280 and first surface 250B of substrate 250, as schematically depicted in FIG. 8B. In some embodiments, second surface 250B of substrate 250 may contact first surface 280A of support 280. This is not mandatory. In some embodiments, second surface 250B of substrate 250 may be spaced apart from first surface 280A of support 280 by, for example, pattern-forming material region(s) 285. Substrate 250 may comprise any suitable material such as, for example, polymer, fabric, paper, ceramic, glass, silicon, silicone, leather or any other desirable material that does not dissolve in solution 44. Substrate 250 may be flexible. Substrate 250 may be sufficiently thin and of low enough thermal conductivity to support the formation of deposition regions and non-deposition regions of differing temperatures.

First surface 250B of substrate 250 is in thermal contact with pattern forming material region(s) 285. The surface defined by the combination of pattern forming material region(s) 285 and first surface 250B may be referred to herein as a laterally patterned opposing surface 257.

Laterally patterned opposing surface 257 is oriented to oppose an initial deposition surface 249 of substrate 250. Laterally patterned opposing surface 257 may be characterized in that traversing laterally patterned opposing surface 257 in at least one direction tangential to laterally patterned opposing surface 257 comprises variation between one or more heatable regions 287 (corresponding to pattern forming material region(s) 285) and one or more other regions 289 (corresponding to regions where there is a lack of pattern forming material). Laterally patterned opposing surface 257 permits selective temperature variation as between the one or more heatable regions 287 and the one or more other regions 289.

Laterally patterned opposing surface 257 may comprise heatable regions 287 and other regions 289 which differ from one another in relation to one or more physical properties which permit selective temperature variation as between the one or more heatable regions 287 and the one or more other regions 289. Non-limiting examples of such physical properties include: differences in thermal conductivity; differences in electrical conductivity; differences in electromagnetic absorptivity; and/or the like. In one particular example embodiment, heatable regions 287 comprise electrically conductive (but resistive) regions that generate heat when current is passed therethrough to cause a corresponding increase in temperature of in heatable regions 287 (as compared to other regions 289). In one particular example embodiment, heatable regions 287 comprise thermally conductive regions that can accept heat energy from external heat sources in thermal contact therewith to cause a corresponding increase in temperature of in heatable regions 287 (as compared to other regions 289).

Laterally patterned opposing surface 257 permits selective temperature variation as between one or more heatable regions 287 and one or more other regions 289. Causing this selective temperature variation between the one or more heatable regions 287 and the one or more other regions 289 causes heat to transfer through substrate 250 to the initial deposition surface 249 and may in turn create a laterally patterned deposition surface 251, which may be used to create a deposited structure as described herein. Specifically, deposition regions 252 on deposition surface 251 may be created by heat transfer through substrate 250 from heatable regions 287 and non-deposition regions 253 may be created by a lack of heat transfer through substrate 250 from other regions 289. To permit heat transfer through substrate 250 from patterned opposing surface 257 to patterned deposition surface 251, substrate 250 may be suitably thin. To permit fidelity of the transfer of the lateral patterning from opposing surface 251 to patterned deposition surface 251, substrate 250 may comprise material that is at least somewhat thermally insulating.

Pattern forming material region(s) 285 may be arranged on support 280 in any suitable manner to heat deposition regions 252 of substrate 250. For example, pattern-forming material region(s) 285 may be arranged on first surface 280A of support 280 in a pattern 282 that is a projection of the lateral pattern of deposition regions 252 and non-deposition regions 253 onto first surface 280A. In some embodiments, to accommodate for dissipation of heat in the X and Y (tangential) directions as the heat travels through substrate 250 in the Z (normal) direction without substantially heating remaining portions 253 sufficiently to cause deposition of deposition material 40 onto remaining portions 253, the X and Y dimensions of individual regions of pattern forming material region(s) 285 are reduced as compared to the corresponding individual deposition regions 252.

At block 216, support 280 (with pattern forming material region(s) 285 and substrate 250) is introduced into vessel 60 (which may be similar to vessel 60 shown in FIG. 1A or 2A). Support 280 may be mounted on a bracket inside vessel 60 or may rest on an interior surface of vessel 60. In some embodiments, vessel 60 is substantially similar to vessel 460 described herein.

At block 218, deposition material 40 and solvent 42 are introduced in vessel 60 to form solution 44. A sufficient volume of deposition material 40 and solvent 42 may be introduced into vessel 60 such that solution 44 is in fluid contact with at least a portion of deposition surface 251. In some embodiments, substantially all of patterned deposition surface 251 is in fluid contact with solution 44. In other embodiments, less than all of patterned deposition surface 251 is in fluid contact with solution 44. In some embodiments, substantially all (e.g. greater than 90%) of the surface area of substrate 150 is in fluid contact with solution 44.

Method 200 continues to blocks 220 and 222 where the temperature, $T_{sol}$, of solution 44 is varied and the pressure, $P_{sol}$, of solution 44 is increased to increase the solubility of deposition material 40 in solvent 42. Blocks 220 and 222 may occur simultaneously or in series. Blocks 220 and 222 may be substantially similar to blocks 118 and 120 of method 100 described herein.

Figure 8C:
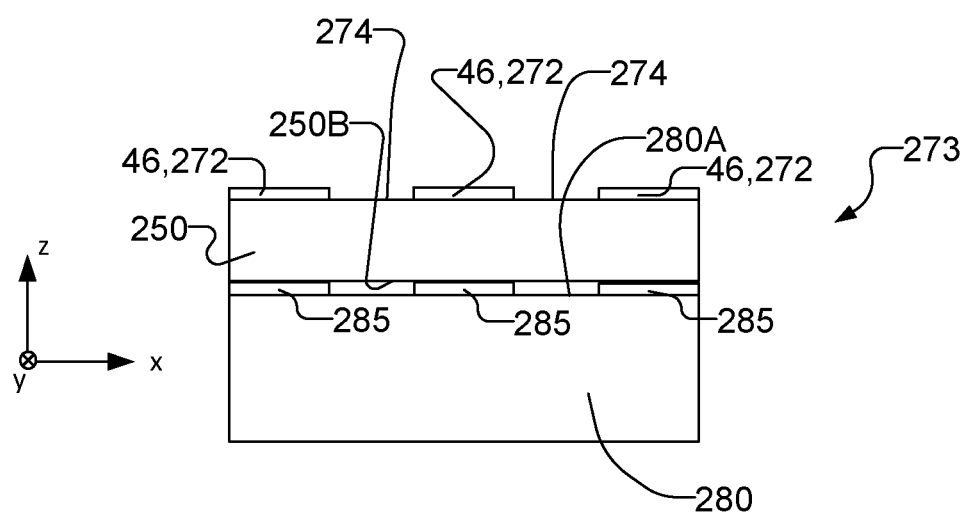
FIG. 8C is a schematic depiction of a laterally patterned deposited structure formed by depositing material onto the deposition surface of FIG. 8B.

At block 224 of method 200, heat is applied to or generated in heatable regions 287 of patterned opposing surface 257. This heat is transferred through substrate 250 to deposition regions 252. Deposition regions 252 are heated to a temperature greater than the temperature of a bulk of solution 44. In some embodiments, heatable regions 287 are heated by conducting electrical current through resistive material. In some embodiments, heatable regions 287 are heated by thermal contact of thermally conductive heatable regions 287 with a heat source. In some embodiments, heatable regions 287 are heated by application of radiation energy to absorptive heatable regions 287. The heat transferred through substrate 250 from heatable regions 287 to deposition regions 252 causes a localized increase in the temperature of solution 44 in a vicinity of deposition regions 252, which in turn reduces the solubility of deposition material 40 in solvent 42 and causes a corresponding precipitation of deposition material 40 out of solvent 42 and deposition of deposition material 40 onto deposition regions 252. In some embodiments, the block 224 increase in temperature of the deposition regions 252 increases the temperature of the deposition regions 252 to localized temperatures greater than the solubility maximum temperature of deposition material 40 in solvent 42. In some embodiments, the block 224 increase in temperature of the deposition regions 252 increases the temperature of the deposition regions 252 more than 10° C. relative to the bulk of solution 44. In some embodiments, this temperature difference is greater than 20° C. In some embodiments, this temperature difference is greater than 30° C. The rate of deposition of deposition material in block 122 may be correlated with this temperature difference—i.e. larger temperature differences result in faster deposition rates. The desired temperature increase of the deposition regions 252 (relative to the bulk of solution 44) may depend on the particular choice of solvent 42 and deposition material 40. Referring to FIG. 8C, this deposition of deposition material 40 onto deposition regions 252 forms a deposited structure 273 comprising: deposited regions 272, where deposited material 46 overlaps deposition surface 251 in directions locally normal to deposition surface 251; and non-deposited regions 274, free of deposited material 46 overlapping deposition surface 251 in directions locally normal to deposition surface 251. Other than for the indirect application of heat to deposition regions 252 through substrate 250, the block 224 deposition of material onto deposition surface 251 is similar to the deposition of material onto deposition surface 151 in block 122 described above.

Selectively heating heatable regions 287 of laterally patterned opposing surface 257 may be achieved in any suitable way. For example, in some embodiments, current is driven through heatable regions 287 (e.g. pattern forming material region(s) 285). By passing current through pattern forming material region(s) 285, heatable regions 287 are heated. Heat from heatable regions 287 travels through substrate 250 to heat deposition regions 252 on deposition surface 251. In some embodiments, substrate 250 is sufficiently thin in the Z (normal) direction that the heat from heatable regions 287 does not significantly dissipate in the X and Y (tangential) directions as it travels in the Z direction.

Further processing steps may be employed as desired. For example, a further optional etching step (e.g. block 226 of method 200) to remove unwanted deposition material 40 from substrate 250 may be undertaken to achieve a desired pattern. Block 226 may be similar to block 124 of method 100.

After sufficient deposition of deposition material 40 onto substrate 52 is achieved as desired and optional etching at block 226, support 280 with substrate 250 may be removed from solution 44 at block 228. Removing support 280 with substrate 250 from solution 44 may involve reducing the pressure of vessel 60 and draining solution 44 from vessel 60. Solution 44 may be drained into an ambient environment or a secondary vessel having a pressure higher than ambient pressure but lower than the pressure inside vessel 60. In some embodiments, solution 44 may be drained into a vacuum to increase the rate at which solution 44 is drained from vessel 60.

At block 230, substrate 250 with the deposited deposition material 40, is removed from support 280 and pattern-forming material 285. By employing support 280, substrate 250 may not have any pattern-forming material 170 (or pattern forming materials 285) attached thereto at the end of method 200. Furthermore, employing support 280 may facilitate depositing deposition material 40 on a flexible substrate 250 such as a polymer or cloth. Support 280 and pattern forming material may optionally be reused to deposit deposition material 40 on another substrate 250 by repeating blocks 214 to 230 of method 200.

In some embodiments, a electromagnetic radiation source may be employed to selectively heat portions of a deposition surface of the substrate (e.g. block 122 of method 100 and/or block 224 of method 200) instead of resistive heating. Any suitable electromagnetic radiation source of any frequency that can be absorbed by a substrate 350 or a film 370 that has been deposited on substrate 350 may be employed. To avoid scatter and refraction of light by solution 44, substrate 350 may be arranged such that only surface 351 of substrate 350 is in contact with solution 44. For example, substrate 350 may be optically transparent and arranged as a wall of vessel 60 (e.g. vessel 60 shown in FIGS. 1A and 2A) so that the electromagnetic radiation source may be applied to first surface 350B of substrate 350 without passing through solution 44.

Figure 9:
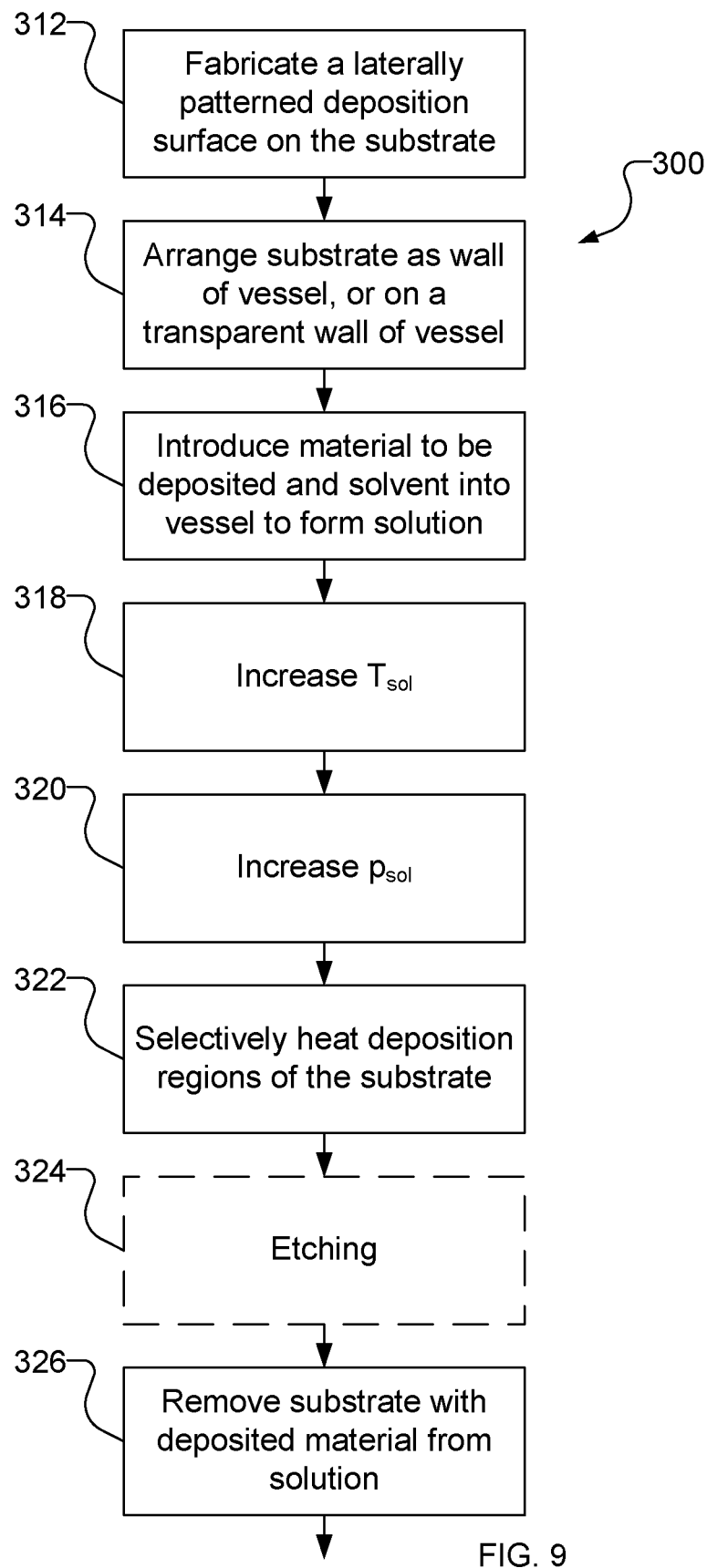
FIG. 9 is a block diagram of a method of depositing a material onto a substrate according to another aspect of the invention.

FIG. 9 is a block diagram of a method 300 of depositing a deposition material 44 onto a deposition surface of a substrate 350 to thereby provide a deposited structure 373 having laterally patterned deposited regions 372 and non-deposited regions 374 by heating deposition regions 352 with an electromagnetic radiation source 390 according to one aspect of the invention. Substrate 350 may be substantially similar to substrate 50 (or substrate 150).

To avoid scatter and/or refraction of electromagnetic radiation from electromagnetic radiation source 390 by solution 44, substrate 350 may be arranged such that first surface 350B of substrate 350 is substantially free from contact with solution 44. For example, substrate 350 may be arranged as a wall of vessel 60 so that electromagnetic radiation source 390 may apply electromagnetic radiation to first surface 350B of substrate 350 without electromagnetic radiation passing through solution 44. In such cases, substrate 350 may be comprise any of the materials discussed herein relation to substrates 50, 150 (or support 280) that have sufficient structural rigidity to function as a wall of vessel 60. In other embodiments, substrate 350 may be arranged on an interior surface of an optically transparent wall of vessel 60 so that electromagnetic radiation source 390 may apply electromagnetic radiation to first surface 350B of substrate 350 without electromagnetic radiation passing through solution 44. In such embodiments, substrate 350 may be comprise any of the materials discussed herein relation to substrates 50, 150 (including, for example, flexible materials without sufficient structural rigidity to function as a wall of vessel 60).

Method 300 starts at block 312 where a laterally patterned deposition surface 351 is fabricated on substrate 350 by fabricating a laterally patterned opposing surface 357 on first surface 350B of substrate 350. Laterally patterned opposing surface 357 may be fabricated by selectively applying a pattern-forming material 370 to first surface 350B of substrate 350 in a pattern 356 as shown by the exemplary drawings of FIG. 10A and FIG. 10B. Although not depicted, pattern-forming material 370 could be spaced apart from second surface 350 by, for example, an optically transparent wall of vessel 60 or otherwise. Pattern 356 may be substantially similar to pattern 56. In some embodiments, pattern 356 is a projection of pattern 354 of deposition regions 352 and non-deposition regions 353 onto first surface 350B.

First surface 350B of substrate 350 is in thermal contact with pattern forming material 370. The surface defined by the combination of pattern forming material 370 and first surface 350B may be referred to herein as a laterally patterned opposing surface 357.

Laterally patterned opposing surface 357 is oriented to oppose an initial deposition surface 349 of substrate 350. Laterally patterned opposing surface 357 may be characterized in that traversing laterally patterned opposing surface 357 in at least one direction tangential to laterally patterned opposing surface 357 comprises variation between one or more heatable regions 387 (corresponding to pattern forming material 370) and one or more other regions 389 (corresponding to regions where there is a lack of pattern forming material). Laterally patterned opposing surface 357 permits selective temperature variation as between the one or more heatable regions 387 and the one or more other regions 389.

Laterally patterned opposing surface 357 may comprise heatable regions 387 and other regions 389 which differ from one another in relation to one or more physical properties which permit selective temperature variation as between the one or more heatable regions 387 and the one or more other regions 389. Non-limiting examples of such physical properties include: differences in thermal conductivity; differences in electrical conductivity; differences in electromagnetic absorptivity; and/or the like. In one particular example embodiment, heatable regions 387 comprise electromagnetically absorptive regions that generate heat when electromagnetic radiation is applied thereto to cause a corresponding increase in temperature of in heatable regions 387 (as compared to other regions 389).

Laterally patterned opposing surface 357 permits selective temperature variation as between one or more heatable regions 387 and one or more other regions 389. Causing this selective temperature variation between the one or more heatable regions 387 and the one or more other regions 389 causes heat to transfer through substrate 350 to the initial deposition surface 349 and may in turn create a laterally patterned deposition surface 351, which may be used to create a deposited structure as described herein. Specifically, deposition regions 352 on deposition surface 351 may be created by heat transfer through substrate 350 from heatable regions 387 and non-deposition regions 353 may be created by a lack of heat transfer through substrate 350 from other regions 389. To permit heat transfer through substrate 350 from patterned opposing surface 357 to patterned deposition surface 351, substrate 350 may be suitably thin. To permit fidelity of the transfer of the lateral patterning from opposing surface 351 to patterned deposition surface 351, substrate 350 may comprise material that is at least somewhat thermally insulating.

Pattern forming material region(s) 385 may be arranged on substrate in any suitable manner to heat deposition regions 352 of substrate 350. For example, pattern-forming material region(s) 385 may be arranged on first surface 380A of support 380 in a pattern 382 that is a projection of the lateral pattern of deposition regions 352 and non-deposition regions 353 onto first surface 380A. In some embodiments, to accommodate for dissipation of heat in the X and Y (tangential) directions as the heat travels through substrate 350 in the Z (normal) direction without substantially heating remaining portions 353 sufficiently to cause deposition of deposition material 40 onto remaining portions 353, the X and Y dimensions of individual regions of pattern forming material region(s) 385 are reduced as compared to the corresponding individual deposition regions 352.

In the case of the illustrated embodiment, the pattern-forming material 370 may be any pattern-forming material described herein and may be absorptive, non-absorptive or reflective to permit a selective increase in temperature of deposition regions 352 relative to non-deposition regions 353.

Figures 10A, 10B:
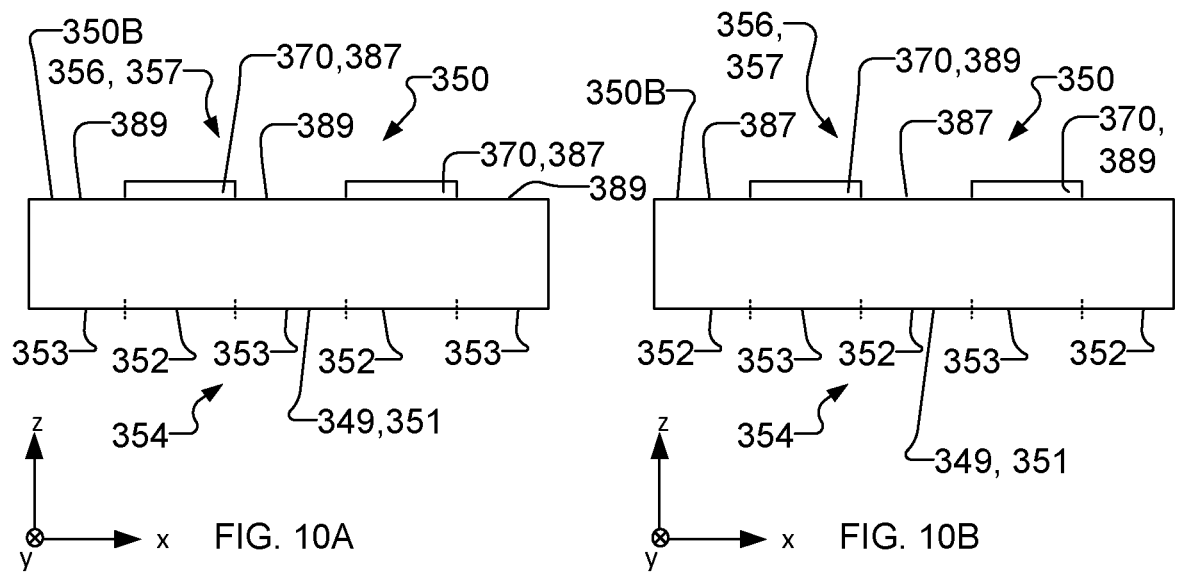
FIGS. 10A and 10B are a schematic depiction of cross-sections of substrates and their laterally patterned deposition surface according to one embodiment of the invention.

In the FIG. 10A embodiment, pattern-forming material 370 is absorptive such that a temperature of pattern-forming material 370 increases when electromagnetic radiation is applied to pattern-forming material 370 while first surface 350B is not absorptive (e.g. first surface 350B may be reflective or otherwise non-absorptive relative to pattern-forming material 370). In the FIG. 10A embodiment, deposition region 352 is defined by a projection of pattern 356 of pattern-forming material 370 (heatable regions 387) onto deposition surface 351 and non-deposition region 353 is defined by a projection of the portions of first surface 350B of substrate 350 to which pattern-forming material 370 is not applied (other regions 389) onto deposition surface 351.

In the FIG. 10B embodiment, pattern-forming material 370 is non-absorptive (e.g. pattern-forming material 370 is reflective or otherwise non-absorptive relative to first surface 350B of substrate 350) such that a temperature of pattern-forming material 370 does not increase when electromagnetic radiation is applied to pattern-forming material 370 while first surface 350B of substrate 350 is absorptive such that a temperature of first surface 350B increases when electromagnetic radiation is applied thereto. In the FIG. 10B embodiment, non-deposition region 353 on deposition surface 351 is defined by a projection of pattern 356 of pattern-forming material 370 (other regions 389) onto deposition surface 351 and deposition region 352 on deposition surface 351 is defined by a projection of the portions of first surface 350B of substrate 350 to which pattern-forming material 370 is not applied (heatable regions 387). For simplicity, and except where otherwise noted, method 300 is generally described in relation to the FIG. 10A embodiment and it should be understood that a person of skill in the art could modify method 300 to employ the FIG. 10B embodiment of pattern-forming material 370.

Pattern-forming material 370 may comprise any suitable pattern-forming material as is known in the art and may be applied to first surface 350B in any suitable manner. Examples of non-absorptive (e.g. reflective) pattern-forming materials 370 include glass or other transparent materials that are coated with metal and/or dielectric films such as, but not limited to, chromium coated glass, chromium and molybdenum silicide coated glass, chromium coated sapphire, chromium and molybdenum silicide coated sapphire. Alternatively, thin sheets or foils in which the pattern is formed by removing portions of the sheet or foil can also be used, for example, steel, tungsten, or silicon. Examples of absorptive pattern-forming materials 370 include glass and other transparent materials coated with materials that absorb electromagnetic radiation at the desired wavelength. Examples of absorbing materials are semiconductors and semimetals including silicon, gallium arsenide, lead sulfide, lead selenide, lead telluride, zinc selenide, zinc sulfide, germanium, selenium, doped or chemically reduced metal oxides including zinc oxide and titanium oxide.

At block 314, substrate 350 is arranged as a wall of vessel 60. Although not depicted, substrate 350 could alternatively be arranged on an interior surface of an optically transparent (e.g. non-absorptive) wall of a vessel 60. Substrate 350 may be arranged to function as a wall of vessel 60 or attached to a wall of vessel 60 in any suitable manner (see, for example, vessel 460 of FIG. 11B).

Figure 10C:
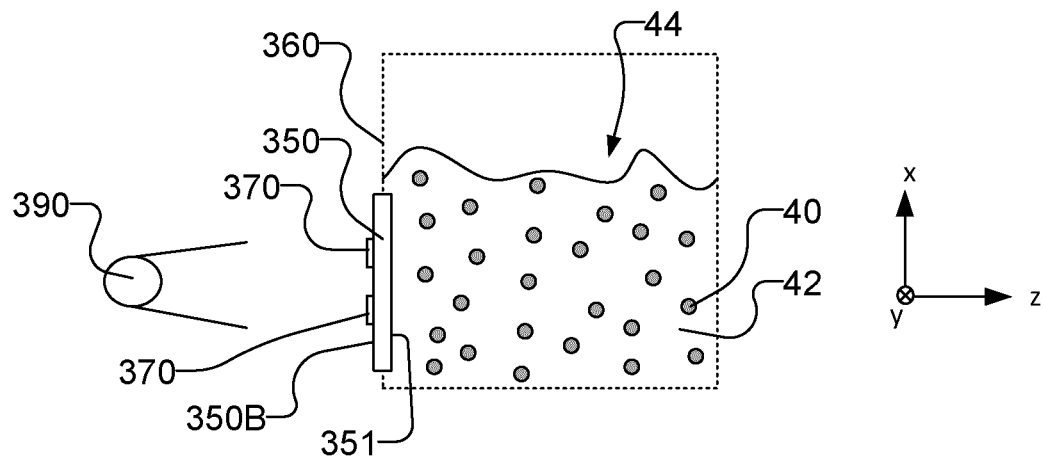
FIG. 10C is a schematic depiction of a cross section of a substrate and its laterally patterned deposition surface layered arranged as a cavity-defining wall of a vessel.

At block 316 of method 300, deposition material 40 and solvent 42 are introduced into vessel 60 to form solution 44 such that at least deposition surface 351 of substrate 350 is in fluid contact with solution 344 as shown in FIG. 10C.

Method 300 continues to blocks 318 and 320 where the temperature, $T_{sol}$, of solution 44 is varied and the pressure, $p_{sol}$, of solution 44 is varied to increase the solubility of deposition material 40 in solvent 42. Blocks 318 and 320 may occur simultaneously or in series. Blocks 318 and 320 may be substantially similar to blocks 18 and 20 of method 100 described herein.

At block 322 of method 300, heat is applied to or generated in heatable regions 387 of patterned opposing surface 357 by irradiation of substrate 350. This heat is transferred through substrate 350 to deposition regions 352. Deposition regions 352 are heated to a temperature greater than the temperature of a bulk of solution 44. In some embodiments, heatable regions 387 are heated by application of radiation energy to absorptive (or reflective) heatable regions 387. The heat transferred through substrate 350 from heatable regions 387 to deposition regions 352 causes a localized increase in the temperature of solution 44 in a vicinity of deposition regions 352, which in turn reduces the solubility of deposition material 40 in solvent 42 and causes a corresponding precipitation of deposition material 40 out of solvent 42 and deposition of deposition material 40 onto deposition regions 352. In some embodiments, the block 322 increase in temperature of the deposition regions 352 increases the temperature of the deposition regions 352 to localized temperatures greater than the solubility maximum temperature of deposition material 40 in solvent 42. In some embodiments, the block 322 increase in temperature of the deposition regions 352 increases the temperature of the deposition regions 352 more than 10° C. relative to the bulk of solution 44. In some embodiments, this temperature difference is greater than 20° C. In some embodiments, this temperature difference is greater than 30° C. The rate of deposition of deposition material in block 122 may be correlated with this temperature difference—i.e. larger temperature differences result in faster deposition rates. The desired temperature increase of the deposition regions 352 (relative to the bulk of solution 44) may depend on the particular choice of solvent 42 and deposition material 40. Referring to FIG. 8C, this deposition of deposition material 40 onto deposition regions 352 forms a deposited structure 373 comprising: deposited regions 372, where deposited material 46 overlaps deposition surface 351 in directions locally normal to deposition surface 351; and non-deposited regions 374, free of deposited material 46 overlapping deposition surface 351 in directions locally normal to deposition surface 351. Other than for the indirect application of heat to deposition regions 352 through substrate 350, the block 324 deposition of material onto deposition surface 351 is similar to the deposition of material onto deposition surface 151 in block 122 described above.

Figure 10D:
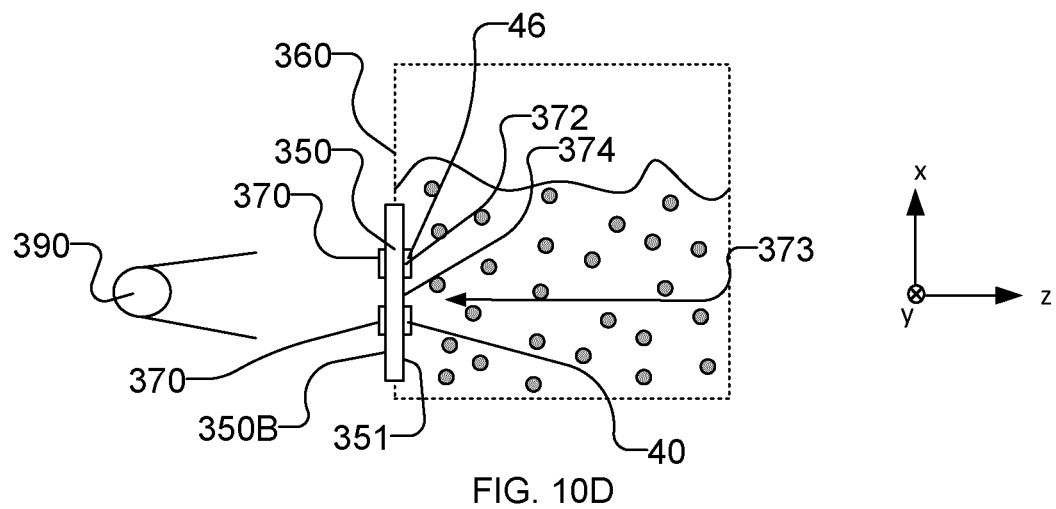
FIG. 10D is a schematic depiction of a laterally patterned deposited structure formed by depositing material onto the deposition surface of FIG. 10C.

Selectively heating deposition regions 352 may be achieved by applying electromagnetic radiation from electromagnetic radiation source 390 to opposing surface 357. Referring to the FIG. 10A embodiment, the electromagnetic radiation from electromagnetic radiation source 390 is absorbed by pattern-forming material 370 to thereby heat pattern-forming material 370. The heat from pattern-forming material 370 is thermally conducted through substrate 350 to heat deposition regions 352. The heated deposition regions 352 cause the solubility of deposition material 40 in the vicinity of heated deposition regions 352 to decrease thereby causing deposition material 40 to precipitate out of solution 44 and deposit on deposition regions 352, as shown in FIG. 10D. Electromagnetic radiation from electromagnetic radiation source 390 that contacts first surface 350B may be reflected or may pass through substrate 350 without being substantially absorbed by substrate 350 (e.g. without substantially affecting the temperature of non-deposition regions 353 and/or without causing substantial deposition of material 40 onto non-deposition regions 353). Any suitable electromagnetic radiation source 390 of any frequency that can be absorbed by substrate 350 or pattern-forming material 370 that has been deposited on substrate 350 may be employed.

Examples of electromagnetic radiation sources 390 include both coherent and incoherent sources with wavelengths in the ultraviolet, visible, near-infrared and mid-infrared regions of the electromagnetic spectrum. Examples of incoherent sources include argon arc lamps, incandescent light bulbs, sodium vapor lamps, mercury vapor lamps, light emitting diodes, neon lamps, mercury blended fluorescent lamps, halogen lamps, metal-halide lamps. Examples of coherent sources include quantum cascade lasers, helium-neon lasers, argon-ion lasers, neodymium yttrium aluminum garnet lasers, neodymium yttrium vanadate lasers, neodymium yttrium lithium fluoride lasers, erbium fiber lasers, titanium sapphire lasers, nitrogen lasers, carbon dioxide lasers, or any laser based on a semiconductor light emitting diode including but not limited to gallium arsenide, gallium nitride, zinc selenide, zinc sulfide, indium phosphide, gallium antimonide, aluminum gallium arsenide, indium gallium nitride, aluminum gallium indium phosphide, gallium indium phosphide/aluminum gallium indium phosphide, aluminum gallium indium phosphide, gallium aluminum arsenide, indigum gallium arsenide phosphide, gallium indium arsenide antimonide. Alternatively, electromagnetic radiation sources in the far infrared, terazhertz, microwave, and radio wave could be used as electromagnetic radiation sources. Examples include, glow bars, IMPATT diodes, Gunn diodes, tunnel diodes, klystron emitters, cavity magnetrons, gyrotrons, travelling wave tubes, and oscillating circuits.

Referring back to the FIG. 10B embodiment, the electromagnetic radiation from electromagnetic radiation source 390 is absorbed by heatable regions 387 of opposing surface 357 (e.g. regions of exposed first surface 350B). The heat from heatable regions 387 is thermally conducted through substrate 350 to heat deposition regions 352. The heated deposition regions 352 cause the solubility of deposition material 40 in the vicinity of heated deposition regions 352 to decrease thereby causing deposition material 40 to precipitate out of solution 44 and deposit on deposition regions 352. Electromagnetic radiation from electromagnetic radiation source 390 that contacts pattern-forming material 370 may be reflected without being substantially absorbed by substrate 350 (e.g. without substantially affecting the temperature of non-deposition regions 353 and/or without causing substantial deposition of material 40 onto non-deposition regions 353).

In some embodiments, substrate 350 is sufficiently thin in the Z (normal) direction that the heat from heatable regions 387 does not significantly dissipate in the X and Y (tangential) directions as it travels in the Z direction.

Further processing steps may be employed as desired. For example, a further optional etching step (e.g. block 324 of method 300) to remove unwanted deposition material 40 from substrate 350 may be undertaken to achieve a desired pattern. Block 324 may be similar to block 24 of method 100.

After sufficient deposition of deposition material 40 onto substrate 352 is achieved as desired and optional etching at block 324, substrate 350 may be removed from solution 44 at block 326. Removing substrate 350 from solution 44 may involve reducing the pressure of vessel 60 and draining solution 44 from vessel 60. Solution 44 may be drained into an ambient environment or a secondary vessel having a pressure higher than ambient pressure but lower than the pressure inside vessel 60. In some embodiments, solution 44 may be drained into a vacuum to increase the rate at which solution 44 is drained from vessel 60.

The methods (e.g. methods 10, 200, 300 etc.) described herein may provide a number of advantages. First, the methods may be adapted to a wide variety of substrates as discussed herein. Second, the size of the substrate on which deposition can take place is only limited by the size of the vessel (e.g. patterned deposition according to the methods herein may be employed with both very large and very small substrates). In some embodiments, because of the high diffusivity of molecules, the majority of the vessel volume may be taken up by the substrate. This is an advantage with flexible substrates which may be loosely rolled (in such a way that fluid can move between layers of the roll) before placement into the vessel. This would allow the deposition of a large surface area to be carried out in a vessel of significantly smaller dimensions than would be possible if the substrate was completely rigid Another advantage of this invention is its ability to deposit polymers and high molecular weight materials through proper solvent choice. Further, deposition material 40 can be deposited in a pattern by spatially controlling the temperature. Because the pattern to be deposited can be patterned beforehand using lithography and other techniques designed to provide, it may be possible to achieve much higher resolution than is available using previously available printing techniques.

Figure 11A:
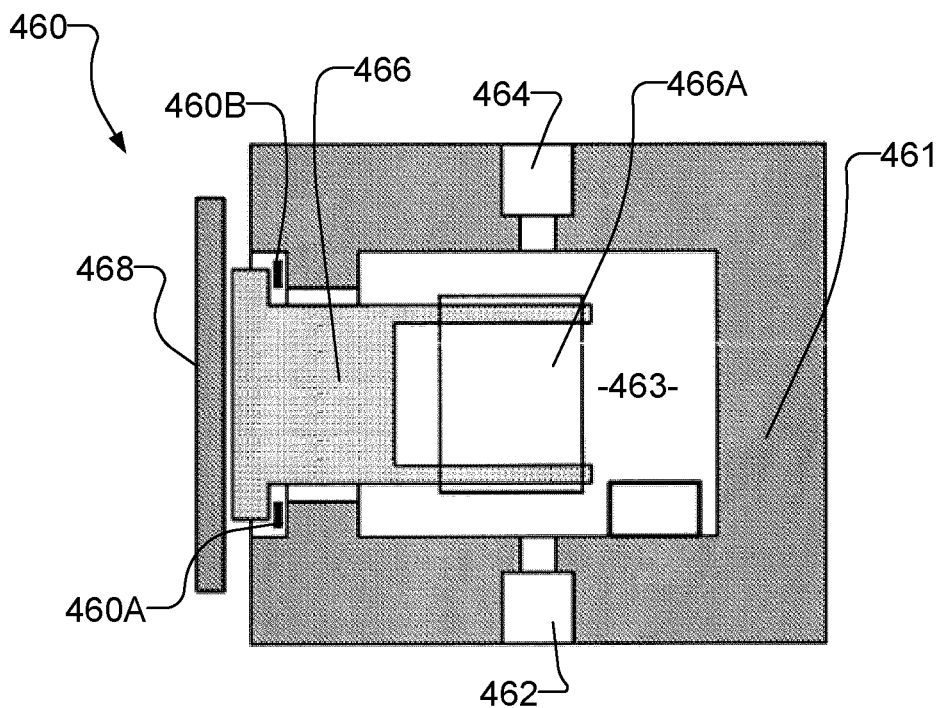
FIG. 11A is a schematic diagram of a vessel for depositing a material onto a substrate according to another aspect of the invention.

Another aspect of the invention provides a vessel for laterally patterned deposition of a deposition material 40 onto a substrate. FIG. 11A schematically depicts a vessel 460. Vessel 460 may be employed as vessel 60. Vessel 460 may be of any suitable shape such that vessel comprises one or more walls 461 that define a cavity 463.

Vessel 460 comprises an inlet 462 and an outlet 464. In some embodiments, inlet 462 is separate from outlet 464. This is not necessary. In some embodiments, inlet 462 may also function as outlet 464. In some embodiments, by placing outlet 464 at a top of vessel 460, or at a top of primary compartment of vessel 460, vessel 460 may be filled completely with solvent 42 or solution 44 thereby allowing for a more complete removal of atmospheric contaminants like oxygen and water.

In some embodiments, vessel 460 comprises a bracket 466 for the mounting of a stage 466A on which patterned deposition of deposition material 40 may take place. For example, substrate 50 may be placed on support 466A at block 114 of method 100 or support 180 may be placed on stage 466A at block 116 of method 200. In some embodiments, stage 466A functions as support 180. In some embodiments, stage 466A is not a structural part of the pressure vessel. Alternatively, any interior surface of vessel 460 could serve as a location for the patterned deposition of a substrate as described herein (e.g. for supporting substrate 50 or support 180 during methods 100, 200, 300 etc.).

In addition to holding stage 466A, bracket 466 may be employed to vary and/or measure the temperature of the sample (e.g. support 180, substrate 50, 250 etc.). For example, thermocouple wires may be placed into thermal contact with bracket 466 and/or stage 466A. In other embodiments, the temperature of the sample (e.g. support 180, substrate 50, 250 etc.) can be measured using a thermistor, or by the infrared emission spectrum of stage 466A.

In some embodiments, stage 466A also has wires capable of carrying currents to stage 466A and/or substrate 50 and/or support 180 for the purpose of varying the temperature of stage 466A and/or substrate 50 and/or support 180 via resistive heating or the like. The thermocouple wires and the current carrying wires may be passed from the exterior of vessel 460 to the interior of the vessel by hermetically sealed feedthroughs or compressive gland fittings or any other suitable technique.

Walls 461 of vessel 460 may define an opening 465 providing access to cavity 463. Opening 465 may allow bracket 466, stage 466A, substrate 50, 150, and/or support 180 etc. to be introduced into cavity 463. In some embodiments, a pressure-tight seal is made between a flange 460A around an outside of opening 465 of vessel 460 and bracket 466 by means of one or more o-rings 460B. O-rings 460B may be clamped in place between flange 460A and bracket 466 by means of a cover 468 that fits over bracket 466 and is secured to vessel 460 by means of bolts and/or other fasteners. The choice of o-ring 460B material may depend on the type of solvents 42 used, and the desired pressures and temperatures employed during the process (e.g. during method 100, 200, 300 etc.). In some embodiments, flat polyimide washers are employed to provide the seal, but Teflon™, polyether ether ketone, polychlorotrifluoroethylene, polyvinylidene difluoride, are among other possible alternatives.

Figure 11B:
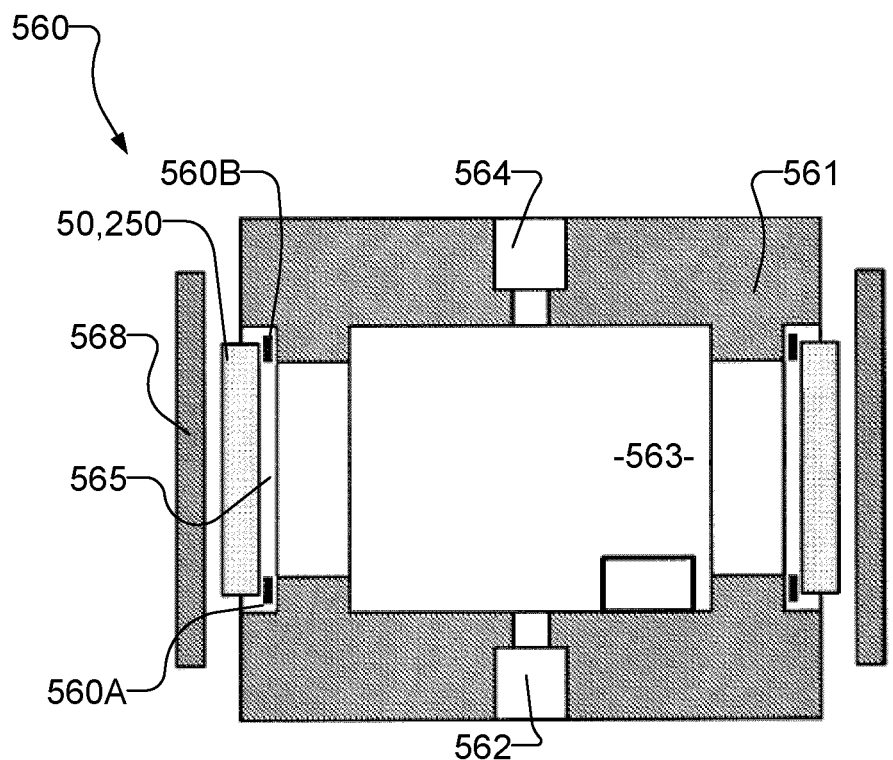
FIG. 11B is a schematic diagram of another vessel for depositing a material onto a substrate according to another aspect of the invention.

FIG. 11B schematically depicts a vessel 560. Vessel 560 may be employed as vessel 60. Like vessel 460, vessel 560 may be of any suitable shape and comprises one or more walls 561 that define a cavity 563. Vessel 560 is substantially similar to vessel 460 except as described herein. For example, like vessel 460, vessel 560 comprises one or more walls 561 that define a cavity 563, an inlet 562 and an outlet 564.

Walls 561 of vessel 560 define one or more openings 565. A substrate 50, 250 etc. may be fitted into each of the one or more openings 565 such that deposition surface 50A, 250A is in fluid contact with cavity 563, second surface 250B is not in fluid contact with cavity 563 and substrate 50, 250 functions as a wall of vessel 560. One or more o-rings 560B may be arranged in flange 560A of window opening 565 to create a pressure-tight seal similar to that of vessel 460. O-rings 560B may be substantially similar to o-rings 460B. A cover 568 may be provided to fit over substrate 50, 250 etc. and is secured to vessel 560 by means of bolds and/or other fasteners. Cover 568 may be optically transparent to allow electromagnetic radiation to pass through cover 568 and onto a surface of substrate 50, 250.

While a number of exemplary aspects and embodiments have been discussed above, those of skill in the art will recognize certain modifications, permutations, additions and sub-combinations thereof. For example:

- In this description and the accompanying claims, elements (such as, by way of non-limiting example, deposited material and deposited regions) are said to overlap one another in or along a direction. For example, deposited material 46 may overlap deposition surface 151 in the Z direction or the normal direction. When it is described that two or more objects overlap in or along a particular direction, this usage should be understood to mean that a line oriented in the particular direction could be drawn to intersect the two or more objects.
- Electromagnetic radiation as discussed herein should be understood to include all types of electromagnetic radiation including, but not limited to, visible light, ultraviolet, visible, near-infrared and mid-infrared regions, light in the far infrared, terahertz, microwave, or radio wave regions of the electromagnetic spectrum.
- Although pattern-forming materials discussed herein (e.g. pattern-forming materials 170, 270, 370) are discussed as being applied on a surface (e.g. a surface of a substrate or a surface of a support), this is not mandatory. In some embodiments, pattern-forming materials are part of the substrate or part of the support (e.g. the substrate or the support are doped with pattern-forming materials). Such doping may occur during formation of the substrate or support, or after initial fabrication steps of the substrate or support. In such embodiments, the resulting laterally patterned deposition surface or laterally patterned opposing surface may be planar similar to deposition surface 51 as opposed to non-planar like deposition surface 151, as depicted.
- It should be understood that any of the methods discussed and/or depicted herein could be me modified such that the step of selectively heating deposition regions is accomplished with electrical resistivity, thermal conductivity or electromagnetic radiation.
- All of the methods described herein are invertible. For example, creating a deposition region by increasing the electrical conductivity of the deposition region (or the corresponding heatable region on the opposing surface) can be inverted by reducing the electrical conductivity of non-deposition regions (or the corresponding other regions on the opposing surface). Similarly, creating a deposition region by increasing the thermal conductivity of the deposition region (or the corresponding heatable region on the opposing surface) can be inverted by reducing the thermal conductivity of non-deposition regions (or the corresponding other regions on the opposing surface). Similarly, creating a deposition region by increasing the absorptivity of the deposition region (or the corresponding heatable region on the opposing surface) can be inverted by reducing the absorptivity of non-deposition regions (or the corresponding other regions on the opposing surface).

It is therefore intended that the following appended claims and claims hereafter introduced are interpreted to include all such modifications, permutations, additions and sub-combinations as are consistent with the broadest interpretation of the specification as a whole.

What is claimed is:

1. A method of depositing a lateral pattern of a deposition material onto a substrate, the method comprising:
fabricating a laterally patterned deposition surface on the substrate, wherein traversing the laterally patterned deposition surface in at least one direction locally tangential to the laterally patterned deposition surface comprises variation between one or more deposition regions and one or more non-deposition, regions, the one or more deposition regions and the one or more non-deposition regions differing from one another to permit a selective temperature variation as between the one or more deposition regions and the one or more non-deposition regions; and
depositing the deposition material onto the one or more deposition regions of the laterally patterned deposition surface to form a deposition structure comprising one or more deposited regions where the deposited material overlaps the deposition surface in directions locally normal to the deposition surface and one or more non-deposited regions free of the deposited material overlapping the deposition surface in directions locally normal to the deposition surface, wherein depositing the deposition material onto the one or more deposition regions of the deposition surface to form the deposition structure comprises:
dissolving the deposition material in a solvent to form a solution
varying a temperature of the solution to be in a vicinity of, but less than, a solubility maximum temperature at which the solubility of the deposition material in the solvent is a maximum; and
selectively heating the one or more deposition regions to one or more localized temperatures greater than the solubility maximum temperature, to thereby cause the deposition material to precipitate from the solution and deposit onto the one or more deposition regions.

2. The method according to claim 1 wherein the one or more deposition regions and the one or more non-deposition regions differ from one another in relation to one or more physical properties which permit the selective temperature variation as between the one or more deposition regions and the one or more non-deposition regions.

3. The method according to claim 2 wherein the one or more deposition regions and the one or more non-deposition regions differ from one another in a manner selected from the group consisting of: (i) in electrical conductivity to permit the selective temperature variation as between the one or more deposition regions and the one or more non-deposition regions by passing current through the one or more deposition regions to thereby cause resistive heating of the one or more deposition regions; (ii) in thermal conductivity to permit the selective temperature variation as between the one or more deposition regions and the one or more non-deposition regions by heating the one or more deposition regions by thermal contact of the one or more deposition regions to one or more corresponding heat sources; and (iii) in electromagnetic absorptivity to permit the selective temperature variation as between the one or more deposition regions and the one or more non-deposition regions by irradiating the one or more deposition regions to thereby cause the one or more deposition regions to absorb radiation energy.

4. The method according to claim 1, wherein fabricating the laterally, patterned deposition surface on the substrate comprises selectively depositing a pattern-forming material onto one or more portions of an initial substrate surface to provide the laterally patterned deposition surface.

5. The method according to claim 1 wherein fabricating the laterally patterned deposition surface on the substrate comprises:
fabricating a laterally patterned opposing surface opposite the laterally patterned deposition surface, wherein traversing the laterally patterned opposing surface in at least one direction tangential to the laterally patterned opposing surface comprises variation between one or more heatable regions and one or more other regions which permits a selective temperature variation as between the one or more heatable regions and the one or more other regions; and
selectively heating the one or more heatable regions of the laterally patterned opposing surface to thereby cause the selective temperature variation as between the one or more deposition regions and the one or more non-deposition regions of the laterally patterned deposition surface.

6. The method according to claim 5 wherein selectively heating the one or more heatable regions of the laterally patterned opposing surface to thereby cause the selective temperature variation as between the one or more deposition regions and the one or more non-deposition regions of the laterally patterned deposition surface comprises transferring heat through the substrate from the one or more heatable regions to the one or more deposition regions.

7. The method according to claim 5 wherein fabricating the laterally patterned deposition surface on the substrate further comprises, after forming the deposition structure, removing the substrate from support and from a pattern-forming material.

8. The method according to claim 1 wherein fabricating the laterally patterned deposition surface on the substrate comprises a step selected from the group consisting of: (i) selectively exposing one or more portions of a surface of the substrate to energy to change a physical property of the one or more portions to thereby provide the laterally patterned deposition surface; and (ii) selectively causing localized chemical reactions on one or more portions of a surface of the substrate to change a physical property of the one or more portions to thereby provide the laterally patterned deposition surface.

9. The method according to claim 1 wherein depositing the deposition material onto the one or more deposition regions of the laterally patterned deposition surface occurs in a cavity of a vessel.

10. The method according to claim 9 wherein introducing the laterally patterned deposition surface into fluid contact with the solution comprises a step selected from the group consisting of: (i) arranging the substrate as a cavity-defining wall of the vessel such that the laterally patterned deposition surface is in fluid contact with the cavity of the vessel; (ii) arranging the substrate on an optically transparent cavity-defining wall of the vessel such that at least the laterally patterned deposition surface is in fluid contact with the cavity of the vessel; (iii) supporting the substrate on a bracket in the cavity of the vessel; and (iv) suspending the substrate on a bracket in the cavity of the vessel.

11. The method according to claim 1 further comprising varying a pressure of the solution, wherein varying the temperature of the solution and varying the pressure of the solution comprises a step selected from the group consisting of: (i) varying the temperature of the solution and varying the pressure of the solution to achieve a maximum solubility of the deposition material in the solvent; (ii) increasing the temperature of the solution and varying the pressure of the solution to achieve a maximum solubility of the deposition material in the solvent; and (iii) varying the temperature of the solution and increasing the pressure of the solution to achieve a maximum solubility of the deposition material in the solvent.

12. The method according to claim 1 wherein selectively heating the one or more deposition regions to temperatures greater than the temperature of the solution comprises a step selected from the group consisting of: (i) selectively heating the one or more deposition regions to temperatures where a solubility of the deposition material in the solvent decreases as compared to the solubility of the deposition material in the solvent at the temperature of the solution; (ii) selectively heating the one or more deposition regions to temperatures at least 1° C. greater than the temperature of the solution; (iii) selectively heating the one or more deposition regions to temperatures at least 10° C. greater than the temperature of the solution; and (iv) selectively heating the one or more deposition regions to temperatures at least 30° C. greater than the temperature of the solution.

13. The method according to claim 1 further comprising etching the deposition structure after deposition of the deposition material.

14. The method according to claim 13 wherein etching the deposition structure after deposition of the deposition material comprises a step selected from the group consisting of: (i) reducing the temperature of the solution; (ii) reducing a pressure of the solution; (iii) decreasing a temperature of the one or more deposition regions; and (iv) increasing a temperature of the one or more deposition regions.

15. The method according to claim 1 wherein the laterally patterned deposition surface is generally planar.

16. The method according to claim 1 wherein the substrate is selected from the group consisting of a non-plastically deformable substrate, a substantially optically transparent substrate, and an opaque substrate.

17. A substrate having a laterally patterned deposition surface fabricated according to claim 1.

18. A substrate having a laterally patterned deposition surface fabricated according to claim 1.

19. The method according to claim 1 wherein the laterally patterned deposition surface is generally non-planar.

20. The method according to claim 1 wherein the substrate is plastically deformable.

* * * * *